United States Patent
Waller et al.

(10) Patent No.: US 7,569,158 B2
(45) Date of Patent: *Aug. 4, 2009

(54) AQUEOUS DISPERSIONS OF POLYTHIENOTHIOPHENES WITH FLUORINATED ION EXCHANGE POLYMERS AS DOPANTS

(75) Inventors: Francis Joseph Waller, Allentown, PA (US); John Bartram Dickenson, North Wales, PA (US); Xuezhong Jiang, Fogelsville, PA (US); Roy Daniel Bastian, Bethlehem, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/240,573

(22) Filed: Oct. 3, 2005

(65) Prior Publication Data

US 2006/0076557 A1  Apr. 13, 2006

Related U.S. Application Data

(60) Provisional application No. 60/665,026, filed on Mar. 24, 2005, provisional application No. 60/618,471, filed on Oct. 13, 2004.

(51) Int. Cl.
H01B 1/12 (2006.01)
(52) U.S. Cl. ................................. 252/500
(58) Field of Classification Search ................ 252/500; 528/226; 549/50
See application file for complete search history.

(56) References Cited

U.S. PATENT DOCUMENTS

| 3,282,875 | A | 11/1966 | Connolly et al. |
| 4,358,545 | A | 11/1982 | Ezzell et al. |
| 4,433,082 | A | 2/1984 | Grot |
| 4,940,525 | A | 7/1990 | Ezzell et al. |
| 5,300,575 | A | 4/1994 | Jonas et al. |
| 5,422,411 | A | 6/1995 | Wei et al. |
| 6,087,196 | A | 7/2000 | Sturm et al. |
| 6,150,426 | A | 11/2000 | Curtin et al. |
| 6,586,764 | B2 | 7/2003 | Buechel et al. |
| 7,183,418 | B2 * | 2/2007 | Heeney et al. ............... 549/50 |
| 2004/0010115 | A1 * | 1/2004 | Sotzing ..................... 528/377 |
| 2004/0074779 | A1 | 4/2004 | Sotzing |

(Continued)

FOREIGN PATENT DOCUMENTS

EP  1 026 152  8/2000

(Continued)

OTHER PUBLICATIONS

Sotzing et al "Intrinsically Conducting Polymers and Green Chemistry", Polymer Preprints 2002, 43(2), 904-905.*

(Continued)

*Primary Examiner*—Mark Kopec
(74) *Attorney, Agent, or Firm*—Michael K. Boyer

(57) ABSTRACT

Compositions are provided comprising aqueous dispersions of polythienothiophenes and colloid-forming polymeric acids. Films from invention compositions are useful as hole injection layers in organic electronic devices, including electroluminescent devices, such as, for example, organic light emitting diodes (OLED) displays, as hole extraction layers in organic optoelectronic devices, such as organic photovoltaic devices, and in combination with metal nanowires or carbon nanotubes in applications such as drain, source, or gate electrodes in thin film field effect transistor.

22 Claims, 11 Drawing Sheets

U.S. PATENT DOCUMENTS

| | | | |
|---|---|---|---|
| 2004/0102577 A1* | 5/2004 | Hsu et al. | 525/182 |
| 2004/0121210 A1 | 6/2004 | Hamrock et al. | |
| 2005/0037265 A1 | 2/2005 | Watakabe | |
| 2005/0151122 A1* | 7/2005 | Jiang et al. | 252/500 |
| 2006/0076557 A1 | 4/2006 | Waller et al. | |
| 2006/0231828 A1 | 10/2006 | De Kok-Van Breeman et al. | |
| 2007/0112171 A1* | 5/2007 | Li et al. | 528/373 |
| 2008/0121846 A1* | 5/2008 | Hsu et al. | 252/500 |

FOREIGN PATENT DOCUMENTS

| | | |
|---|---|---|
| JP | 07-188399 A | 7/1995 |
| JP | 2006-500463 A | 1/2006 |
| WO | WO 03/006537 | 1/2003 |
| WO | 2004/029128 A2 | 4/2004 |

OTHER PUBLICATIONS

Lee et al "Aqueous Phase Polymerization of thieno(3,4-b)thiophene", Polymer Preprints 2002,43(2) 568-569.*

Wu, Theiss, Gu, Lu, Sturm, Wagner and Forrest; "Integration of Organic LED's and Amorphous Si TFT's onto Flexible and Lightweight Metal Foil Substrates;" IEEEE Electron Device Letters, vol. 18, No. 12, Dec. 1997.

Fyfe, David; Advances in P-OLED Technology, Overcoming the Hurdles Fast presented at Cambridge Display Technology; Nov. 15, 2004.

Wenchen Su, Dmitry Poplavskyy, Franky So, Howard Clearfield, Dean Welsh and Weishi Wu; "Trilayer Polymer OLED Devices for Passive Matrix Applications;" SID 2005 Digest; ISSN/005-966X/05/3602; pp. 1871-1873.

Weijtens, et al, "Effect of the alkali metal content on the electronic properties of PEDOT:PSS," Organic Electronics; 2005, pp. 1-8.

Kok, et al, "Modification of PEDOT:PSS as hole injection layer in polymer LEDs," Phys. Stat. Sol. (a) 201, No. 6, 2004, pp. 1342-1359.

Jiang, Xuezhong, et al, "Resistivity Stable Electrically Conductive Films Formed From Polythiophenes," U.S. Appl. No. 11/760,000, filed Jun. 8, 2007.

Pomerantz et al; "Poly(2-decylthienol(3,4-b)thiophene-4,6-diyl). A New Low Bank Gap Conducting Polymer;" Macromolecules (2001), 34 p. 1817-1822.

Hong et al; "Understanding the Conformational Stability and Electronic Structures of Modified Polymers Based on Polythiophene;" Macromolecules (1992); 25; p. 46552-4657.

Neugebauer, H.; "Infrared signatures of positive and negative charge carriers in conjugated polymers with low band gaps;" Journal of Electroanalytical Chemistry (2004), 563, p. 153-159.

* cited by examiner

AQUEOUS DISPERSIONS OF POLYTHIENOTHIOPHENES WITH FLUORINATED ION EXCHANGE POLYMERS AS DOPANTS

CROSS-REFERENCE TO RELATED APPLICATIONS

This application claims the benefit of Provisional Application No. 60/665,026, filed Mar. 24, 2005, and Provisional Application No. 60/618,471, filed Oct. 13, 2004. The disclosure of these Applications is hereby incorporated by reference.

BACKGROUND OF THE INVENTION

The invention relates to aqueous dispersions comprising electrically conducting thienothiophene polymers, wherein the electrically conducting polymer is synthesized in the presence of at least one colloid forming polymeric acid.

Electrically conducting polymers have been used in a variety of organic electronic devices, including in the development of electroluminescent (EL) devices for use in light emissive displays. With respect to EL devices, such as organic light emitting diodes (OLEDs) containing conducting polymers, such devices generally have the following configuration:

anode/hole injection layer/EL layer/cathode

The anode is typically any material that has the ability to inject holes into the otherwise filled π-band of the semiconducting material used in the EL layer, such as, for example, indium/tin oxide (ITO). The anode is optionally supported on a glass or plastic substrate. The EL layer is typically semiconducting, conjugated organic material, including a conjugated semiconducting polymer such as poly(paraphenylenevinylene), polyfluorene, spiropolyfluorene or other EL polymer material, a small molecule fluorescent dye such as 8-hydroxyquinoline aluminum ($Alq_3$), a small molecule phosphorescent dye such as fac tris(2-phenylpyridine) Iridium (III), a dendrimer, a conjugated polymer grafted with phosphorescent dye, a blend that contains the above-mentioned materials, and combinations. The EL layer can also be inorganic quantum dots or blends of semiconducting organic material with inorganic quantum dots. The cathode is typically any material (such as, e.g., Ca or Ba) that has the ability to inject electrons into the otherwise empty π*-band of the semiconducting organic material in the EL layer.

The hole injection layer (HIL) is typically a conducting polymer and facilitates the injection of holes from the anode into the semiconducting organic material in the EL layer. The hole injection layer can also be called a hole transport layer, hole injection/transport layer, or anode buffer layer, or may be characterized as part of a bilayer anode. Typical conducting polymers employed as hole injection layer include polyaniline and polydioxythiophenes such as poly(3,4-ethylenedioxythiophene) (PEDOT). These materials can be prepared by polymerizing aniline or dioxythiophene monomers in aqueous solution in the presence of a water soluble polymeric acid, such as poly(styrenesulfonic acid) (PSSA), as described in, for example, U.S. Pat. No. 5,300,575 entitled "Polythiophene dispersions, their production and their use"; hereby incorporated by reference. A well known PEDOT/PSSA material is Baytron®-P, commercially available from H. C. Starck, GmbH (Leverkusen, Germany).

Electrically conducting polymers have also been used in photovoltaic devices, which convert radiation energy into electrical energy. Such devices generally have the following configuration:

positive electrode/hole extraction layer/light harvesting layer(s)/negative electrode The positive electrode and negative electrode can be selected from materials used for the anode and cathode of EL devices mentioned above. The hole extraction layer is typically a conducting polymer that facilitates the extraction of holes from the light harvesting layers for collection at the positive electrode. The light harvesting layer or layers typically consists of organic or inorganic semiconductors that can absorb light radiation and generate separated charges at an interface.

Aqueous electrically conductive polymer dispersions synthesized with water soluble polymeric sulfonic acids have undesirable low pH levels. The low pH can contribute to decreased stress life of an EL device containing such a hole injection layer, and contribute to corrosion within the device. Accordingly, there is a need in this art for compositions and hole injection layer prepared therefrom having improved properties.

Electrically conducting polymers also have utility as electrodes for electronic devices, such as thin film field effect transistors. In such transistors, an organic semiconducting film is present between source and drain electrodes. To be useful for the electrode application, the conducting polymers and the liquids for dispersing or dissolving the conducting polymers have to be compatible with the semiconducting polymers and the solvents for the semiconducting polymers to avoid re-dissolution of either conducting polymers or semiconducting polymers. The electrical conductivity of the electrodes fabricated from the conducting polymers should be greater than 10 S/cm (where S is a reciprocal ohm). However, the electrically conducting polythiophenes made with a polymeric acid typically provide conductivity in the range of about $10^{-3}$ S/cm or lower. In order to enhance conductivity, conductive additives may be added to the polymer. However, the presence of such additives can deleteriously affect the processability of the electrically conducting polythiophene. Accordingly, there is a need in this art for improved conducting polymers with good processability and increased conductivity.

Due to the limited lifetime of double or bilayer devices, more complicated device structures have been introduced to improve the device performance, especially lifetime. For example, a thin layer of a hole transporting and electron blocking material, which is known as an "interlayer", has been shown to be effective in improving device performance and lifetime. Cambridge Display Technology reported enhanced lifetime with interlayer at OLEDs 2004 conference [David Fyfe, "Advances in P-OLED Technology—Overcoming the Hurdles Fast", OLEDs 2004, San Diego, Calif. from Nov. 15 to 17, 2004; hereby incorporated by reference]. So et al. reported 2× enhancement in efficiency and 7× enhancement in lifetime by inserting a crosslinkable hole transporting layer (XL-HTL) between the PEDOT:PSSA hole injection layer and a green polyfluorene light emitting layer. [Wencheng Su, Dmitry Poplavskyy, Franky So, Howard Clearfield, Dean Welsh, and Weishi Wu, "Trilayer Polymer OLED Devices for Passive Matrix Applications", SID 05 Digest, Page 1871-1873; hereby incorporated by reference].

Although these trilayer devices provide improved device performance and lifetime, the additional interlayer increases TACT time and/or manufacturing capital cost, and might decrease device yields. There is a need in this art for a double layer device with improved device performance and lifetime.

BRIEF SUMMARY OF THE INVENTION

The instant invention solves problems associated with conventional materials by providing aqueous dispersions comprising polythienothiophenes (PTT) and at least one colloid-forming polymeric acid. The inventive compositions are useful as hole injection layer in a variety of organic electronic devices, such as for example, organic light emitting diodes (OLEDs), as hole extraction layer in a variety of organic optoelectronic devices, such as for example, organic photovoltaic devices (OPVDs), and in combination with conductive fillers, such as metal nanowires or carbon nanotubes, in applications such as drain, source, or gate electrodes in thin film field effect transistors, among other applications.

In accordance with one embodiment, the instant invention relates to organic electronic devices, including electroluminescent devices, comprising hole injection layer of the inventive compositions. The instant invention permits fabricating bi-layered devices having acceptable lifetime performance. By "lifetime" it is meant the length of time taken for an initial brightness of a continuously operating device (e.g., a PLED) to decrease to a ratio of the initial brightness that is acceptable for the targeted application (e.g., 50% of the initial brightness).

In accordance with another embodiment, the instant invention relates to methods for synthesizing aqueous dispersions comprising polythienothiophenes and at least one colloid-forming polymeric acid. A method of producing an aqueous dispersion comprising polythienothiophene and at least one colloid-forming polymeric acid, comprises:
 (a) providing an aqueous solution comprising at least one oxidant and/or at least one catalyst;
 (b) providing an aqueous dispersion comprising the colloid-forming polymeric acid;
 (c) combining the aqueous solution of the oxidant and/or catalyst with the aqueous dispersion of the colloid-forming polymeric acid, and
 (d) adding thienothiophene monomer to the combined aqueous dispersion of step (c).

The inventive polythienothiophene dispersions can be applied onto any suitable substrate, and dried. If desired, the polythienothiophene coated substrate can be heated under conditions sufficient to impart a desired conductivity, device performance and lifetime performance.

DETAILED DESCRIPTION OF THE INVENTION

Figure 1:
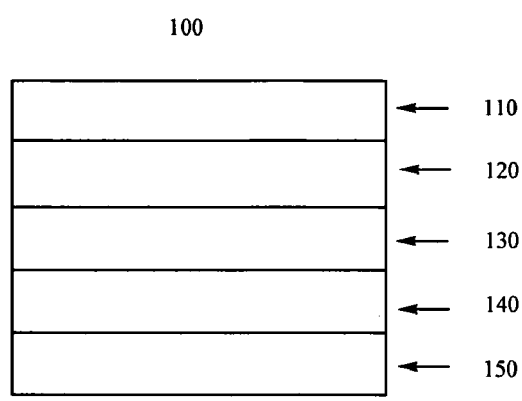
FIG. 1 illustrates a cross-sectional view of an electronic device that includes a hole injection layer according to the invention.

The instant invention relates to aqueous dispersions comprising polythienothiophenes, methods for making and applying such dispersions, and devices incorporating polythienothiophene containing films. The inventive dispersions can comprise polythienothiophenes, including, poly(thieno [3,4-b]thiophenes), and colloid-forming polymeric acids (e.g., at least partially fluorinated ion exchange polymers). As used herein, the term "dispersion" refers to a liquid medium comprising a suspension of minute colloid particles. In accordance with the invention, the "liquid medium" is typically an aqueous liquid, e.g., de-ionized water. As used herein, the term "aqueous" refers to a liquid that has a significant portion of water and in one embodiment it is at least about 40% by weight water. As used herein, the term "colloid" refers to the minute particles suspended in the liquid medium, said particles having a particle size up to about 1 micron (e.g., about 20 nanometers to about 800 nanometers and normally about 30 to about 500 nanometers). As used herein, the term "colloid-forming" refers to substances that form minute particles when dispersed in aqueous solution, i.e., "colloid-forming" polymeric acids are not water-soluble.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

In one aspect of the invention, aqueous dispersions comprising electrically conductive polythienothiophenes such as poly(thieno[3,4-b]thiophene) can be prepared when thienothiophene monomers including thieno[3,4-b] thiophene monomers, are polymerized chemically in the presence of at least one colloid-forming polymeric acid. The use of a polymeric acid that is not water soluble in preparation of an aqueous dispersion of the polythienothiophenes or poly (thieno[3,4-b]thiophenes) can yield a composition with superior electrical properties (e.g., conductivity of about $10^{-1}$ to about $10^{-6}$ S/cm). One advantage of these aqueous dispersions is that the electrically conductive particles are normally stable in the aqueous medium (e.g., without forming a separate phase) over a relatively long period of time (e.g., the dispersions are stable for about 14 to about 180 days). Moreover, the conductive particles generally do not re-disperse once dried into films.

Compositions according to one embodiment of the invention comprise a continuous aqueous phase in which the poly(thieno[3,4-b]thiophene) and colloid-forming polymeric acid are dispersed. Poly(thieno[3,4-b]thiophenes) that can be used in the instant invention can have the structure (1):

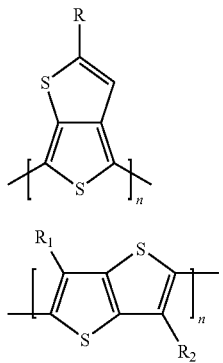

wherein R is selected from hydrogen, an alkyl having 1 to 8 carbon atoms, phenyl, substituted phenyl, $C_mF_{2m+1}$, F, Cl, and $SF_5$, and n is greater than about 2 and less than 20 and normally about 4 to about 16. Thienothiophenes that can be used in the compositions of this invention may also have the structure (2) as provided above, wherein $R_1$ and $R_2$ are independently selected from the list above. In one particular embodiment, the polythienothiophene comprises poly(thieno[3,4-b]thiophene) wherein R comprises hydrogen.

Colloid-forming polymeric acids contemplated for use in the practice of the invention are insoluble in water, and form colloids when dispersed into a suitable aqueous medium. The polymeric acids typically have a molecular weight in the range of about 10,000 to about 4,000,000. In one embodiment, the polymeric acids have a molecular weight of about 50,000 to about 2,000,000. Any polymeric acid that is colloid-forming when dispersed in water is suitable for use in the practice of the invention. In one embodiment, the colloid-forming polymeric acid comprises polymeric sulfonic acid. Other acceptable polymeric acids comprise at least one member of polymer phosphoric acids, polymer carboxylic acids, and polymeric acrylic acids, and mixtures thereof, including mixtures having polymeric sulfonic acids. In another embodiment, the polymeric sulfonic acid comprises a fluorinated acid. In still another embodiment, the colloid-forming polymeric sulfonic acid comprises a perfluorinated compound. In yet another embodiment, the colloid-forming polymeric sulfonic acid comprises a perfluoroalkylenesulfonic acid.

In still another embodiment, the colloid-forming polymeric acid comprises a highly-fluorinated sulfonic acid polymer ("FSA polymer"). "Highly fluorinated" means that at least about 50% of the total number of halogen and hydrogen atoms in the polymer are fluorine atoms, and in one embodiment at least about 75%, and in another embodiment at least about 90%. In one embodiment, the polymer comprises at least one perfluorinated compound.

The polymeric acid can comprise sulfonate functional groups. The term "sulfonate functional group" refers to either sulfonic acid groups or salts of sulfonic acid groups, and in one embodiment comprises at least one of alkali metal or ammonium salts. The functional group is represented by the formula —$SO_3X$ where X comprises a cation, also known as a "counterion". X can comprise at least one member selected from the group consisting of H, Li, Na, K or $N(R_1)(R_2)(R_3)(R_4)$, and $R_1, R_2, R_3$, and $R_4$ are the same or different, and are in one embodiment H, $CH_3$ or $C_2H_5$. In another embodiment, X comprises H, in which case the polymer is said to be in the "acid form". X may also be multivalent, as represented by such ions as $Ca^{2+}$, $Al^{3+}$, $Fe^{2+}$ and $Fe^{3+}$. In the case of multivalent counterions, represented generally as $M^{n+}$, the number of sulfonate functional groups per counterion will be equal to the valence "n".

In one embodiment, the FSA polymer comprises a polymer backbone with recurring side chains attached to the backbone, the side chains carrying cation exchange groups. Polymers include homopolymers or copolymers of two or more monomers. Copolymers are typically formed from a non-functional monomer and a second monomer carrying a cation exchange group or its precursor, e.g., a sulfonyl fluoride group (—$SO_2F$), which can be subsequently hydrolyzed to a sulfonate functional group. For example, copolymers comprising a first fluorinated vinyl monomer together with a second fluorinated vinyl monomer having a sulfonyl fluoride group (—$SO_2F$) can be used. Examples of suitable first monomers comprise at least one member from the group of tetrafluoroethylene (TFE), hexafluoropropylene, vinyl fluoride, vinylidine fluoride, trifluoroethylene, chlorotrifluoroethylene, perfluoro(alkyl vinyl ether), and combinations thereof. TFE is a desirable first monomer.

In other embodiments, examples of second monomers comprise at least one fluorinated vinyl ether with sulfonate functional groups or precursor groups which can provide the desired side chain in the polymer. Additional monomers, including ethylene, propylene, and R—CH=$CH_2$ where R comprises a perfluorinated alkyl group of 1 to 10 carbon atoms, can, if desired, be incorporated into these polymers. The polymers may be of the type referred to herein as random copolymers (e.g., copolymers made by polymerization in which the relative concentrations of the co-monomers are kept as constant as possible), so that the distribution of the monomer units along the polymer chain is in accordance with their relative concentrations and relative reactivities. Less random copolymers, made by varying relative concentrations of monomers in the course of the polymerization, may also be used. Polymers of the type called block copolymers, such as that disclosed in European Patent Application No. 1 026 152 A1 (incorporated herein by reference), may also be used.

In one embodiment, FSA polymers for use in the present invention comprise at least one highly fluorinated FSA, and in one embodiment perfluorinated, carbon backbone and side chains represented by the formula

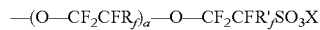
—(O—$CF_2CFR_f$)$_a$—O—$CF_2CFR'_fSO_3X$ wherein $R_f$ and $R'_f$ are independently selected from F, Cl or a perfluorinated alkyl group having 1 to 10 carbon atoms, a=0, 1 or 2, and X comprises at least one of H, Li, Na, K or $N(R_1)(R_2)(R_3)(R_4)$ and $R_1, R_2, R_3$, and $R_4$ are the same or different and are and in one embodiment H, $CH_3$ or $C_2H_5$. In another embodiment X comprises H. As stated above, X may also be multivalent.

In another embodiment, the FSA polymers include, for example, polymers disclosed in U.S. Pat. Nos. 3,282,875, 4,358,545 and 4,940,525 (all hereby incorporated by reference). An example of a useful FSA polymer comprises a perfluorocarbon backbone and the side chain represented by the formula

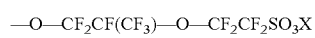
—O—$CF_2CF(CF_3)$—O—$CF_2CF_2SO_3X$ where X is as defined above. FSA polymers of this type are disclosed in U.S. Pat. No. 3,282,875 and can be made by copolymerization of tetrafluoroethylene (TFE) and the perfluorinated vinyl ether $CF_2$=CF—O—$CF_2CF(CF_3)$—O—$CF_2CF_2SO_2F$, perfluoro(3,6-dioxa-4-methyl-7-octenesulfonyl fluoride) (PDMOF), followed by conversion to sulfonate groups by hydrolysis of the sulfonyl fluoride groups and ion exchanged as necessary to convert them to the desired ionic form. An example of a polymer of the type disclosed in U.S. Pat. Nos. 4,358,545 and 4,940,525 has the side chain —O—$CF_2CF_2SO_3X$, wherein X is as defined above. This polymer can be made by copolymerization of tetrafluoroethylene (TFE) and the perfluorinated vinyl ether $CF_2$=CF—O—$CF_2CF_2SO_2F$, perfluoro(3-oxa-4-pentenesulfonyl fluoride) (POPF), followed by hydrolysis and further ion exchange as necessary.

In another embodiment, the FSA polymers include, for example, polymers disclosed in US 2004/0121210 A1; hereby incorporated by reference. An example of a useful FSA polymer can be made by copolymerization of tetrafluoroethylene (TFE) and the perfluorinated vinyl ether $CF_2$=CF—O—$CF_2CF_2CF_2CF_2SO_2F$ followed by conversion to sulfonate groups by hydrolysis of the sulfonyl fluoride groups and ion exchanged as desired to convert the fluoride groups to the desired ionic form. In another embodiment, the FSA polymers include, for example, polymers disclosed in US2005/0037265 A1; hereby incorporated by reference. An example of a useful FSA polymer can be made by copolymerization of $CF_2$=$CFCF_2OCF_2CF_2SO_2F$ and tetrafluoroethylene followed by conversion to sulfonate groups by KOH hydrolysis of the sulfonyl fluoride groups and ion exchanged with acid to convert the potassium ion salt to the acid form.

In other embodiments, the FSA polymers for use in this invention typically have an ion exchange ratio of less than about 33. "Ion exchange ratio" or "IXR" is meant as the number of carbon atoms in the polymer backbone in relation to the cation exchange groups. Within the range of less than about 33, IXR can be varied as desired for the particular application. In one embodiment, the IXR is about 3 to about 33, and in another embodiment about 8 to about 23.

The cation exchange capacity of a polymer is often expressed in terms of equivalent weight (EW). For the purposes of this application, equivalent weight (EW) is defined to be the weight of the polymer in acid form required to neutralize one equivalent of sodium hydroxide. In the case of a sulfonate polymer where the polymer has a perfluorocarbon backbone and the side chain comprises —O—$CF_2$—CF($CF_3$)—O—$CF_2$—$CF_2$—$SO_3H$ (or a salt thereof), the equivalent weight range which corresponds to an IXR of about 8 to about 23, is about 750 EW to about 1500 EW. IXR for this polymer can be related to equivalent weight using the formula: 50 IXR+344=EW. While the same IXR range is used for sulfonate polymers disclosed in U.S. Pat. Nos. 4,358,545 and 4,940,525 (hereby incorporated by reference), e.g., the polymer having the side chain —O—$CF_2CF_2SO_3H$ (or a salt thereof), the equivalent weight is somewhat lower because of the lower molecular weight of the monomer unit containing a cation exchange group. For an IXR range of about 8 to about 23, the corresponding equivalent weight range is about 575 EW to about 1325 EW. IXR for this polymer can be related to equivalent weight using the formula: 50 IXR+178=EW.

The FSA polymers can be prepared as colloidal aqueous dispersions. They may also be in the form of dispersions in other media, examples of which include, without limitation, alcohol, water-soluble ethers, such as tetrahydrofuran, mixtures of water-soluble ethers, and combinations thereof. In making the dispersions, the polymer can be used in acid form. U.S. Pat. Nos. 4,433,082, 6,150,426 and WO 03/006537 (hereby incorporated by reference) disclose methods for making aqueous alcoholic dispersions. After the dispersion is made, the FSA concentration and the dispersing liquid composition can be adjusted by methods known in the art.

Aqueous dispersions comprising colloid-forming polymeric acids, including FSA polymers, typically have particle sizes as small as possible, so long as a stable colloid is formed. Aqueous dispersions of FSA polymer are available commercially as Nafion® dispersions, from E. I. du Pont de Nemours and Company (Wilmington, Del.). An example of a suitable FSA polymer comprises a copolymer having a structure:

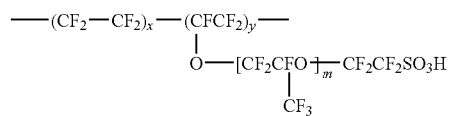

The copolymer comprises tetrafluoroethylene and perfluoro (4-methyl-3,6-dioxa-7-octene-1-sulfonic acid) wherein m=1.

Aqueous dispersions of FSA polymer from US2004/0121210 A1 or US2005/0037265 A1 could be made by using the methods disclosed in U.S. Pat. No. 6,150,426; the disclosure of the previously identified U.S. patents and patent applications is hereby incorporated by reference.

Other suitable FSA polymers are disclosed in U.S. Pat. No. 5,422,411; hereby incorporated by reference. One such suitable polymeric acid that can be used as counter ion/dispersant for polythienothiophenes can have the following structure:

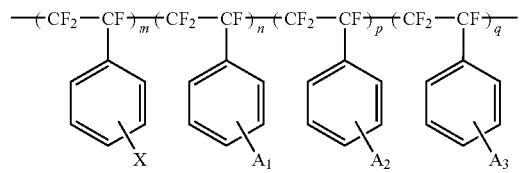

where at least two of m, n, p and q are integers greater than zero; $A_1$, $A_2$, and $A_3$ are selected from the group consisting of alkyls, halogens, $C_yF_{2y+1}$ where y is an integer greater than zero, O—R (where R is selected from the group consisting of alkyls, perfluoroalkyls and aryls), $CF$=$CF_2$, $CN$, $NO_2$ and $OH$; and X is selected from the group consisting of $SO_3H$, $PO_2H_2$, $PO_3H_2$,$CH_2PO_3H_2$, $COOH$, $OPO_3H_2$, $OSO_3H$, $OArSO_3H$ where Ar is an aromatic, $NR_3^+$ (where R is selected from the group consisting of alkyls, perfluoroalkyls and aryls), and $CH_2NR_3^+$ (where R is selected from the group consisting of alkyls, perfluoroalkyls and aryls). The $A_1$, $A_2$, $A_3$ and X substituents may be located in the ortho, meta and/or para positions. The copolymer may also be binary, ternary or quaternary.

In one embodiment, thienothiophene or the thieno[3,4-b] thiophene monomers are oxidatively polymerized in an aqueous medium comprising polymeric acid colloids. Typically, the thienothiophene or thieno[3,4-b]thiophene monomers are combined with or added to an aqueous dispersion comprising at least one polymerization catalyst, at least one oxidizing agent, and colloidal polymeric acid particles. In this embodiment, the order of combination or addition may vary provided that the oxidizer and catalyst is typically not combined with the monomer until one is ready for the polymerization reaction to proceed. Polymerization catalysts include, without limitation, at least one member selected from the group consisting of ferric sulfate, ferric chloride, cerium sulfate, and the like and mixtures thereof. Oxidizing agents include, without limitation, at least one member selected from the group consisting of ferric sulfate, ferric chloride, sodium persulfate, potassium persulfate, ammonium persulfate, and the like, including combinations thereof. In some cases, the oxidant and catalyst can comprise the same compound. The oxidative polymerization results in a stable, aqueous dispersion comprising positively charged conducting polymeric thienothiophene and/or thieno[3,4-b]thiophene that is charge balanced by the negatively charged side chains of the polymeric acids contained within the colloids (e.g., sulfonate anion, carboxylate anion, acetylate anion, phosphonate anion, combinations, and the like). While any suitable process conditions can be employed for polymerizing the thienothiophene, using the temperature ranges from about 8 to about 95 C as well as conditions and equipment sufficient to obtain, mix and maintain a dispersion are useful.

In one embodiment of the invention, a method of making an aqueous dispersions comprising poly(thieno[3,4-b] thiophene) and at least one colloid-forming polymer acid comprises: (a) providing an aqueous dispersion comprising at least one polymer acid; (b) adding at least one oxidizer to the dispersion of step (a); (c) adding at least one catalyst oroxidizer to the dispersion of step (b); and (d) adding thieno[3,4-b]thiophene monomer to the dispersion of step (c). One alternative embodiment to this method comprises adding thieno[3,4-b]thiophene monomer to the aqueous dispersion of a polymeric acid prior to adding the oxidizer. Another embodiment, comprises forming an aqueous dispersion comprising water and thieno[3,4-b]thiophene (e.g., of any number of thieno[3,4-b]thiophene concentrations in water which is typically in the range of about 0.05% by weight to about 50% by weight thieno[3,4-b]thiophene), and add this thieno[3,4-b] thiophene mixture to the aqueous dispersion of the polymeric acid before or after adding the oxidizerand catalyst. In yet another embodiment, thienothiophene monomer is dissolved in an organic solvent that is compatible with water, and the dissolved monomer solution is added to the aqueous dispersion of polymeric acid before or after adding the oxidizer and/or catlayst.

In some cases, the dispersion can include at least one metal (e.g., at least one ion). Examples of metals that can be added or present in the dispersion comprise at least one member selected from the group consisting of $Fe^{2+}$, $Fe^{3+}$, $K^+$, and $Na^+$, mixtures thereof, among others. The oxidizer:monomer molar ratio is usually about 0.05 to about 10, generally in the range of about 0.5 to about 5. (e.g., during the inventive polymerization steps). If desired, the amount of metal can be lowered or removed by exposing the dispersion to cationic and ionic exchange resins.

The thienothiophene monomer polymerization can be carried out in the presence of co-dispersing liquids which are normally miscible with water. Examples of suitable co-dispersing liquids comprise at least one member selected from the group consisting of ethers, alcohols, ethers, cyclic ethers, ketones, nitrites, sulfoxides, and combinations thereof. In one embodiment, the amount of co-dispersing liquid is less than about 30% by volume. In one embodiment, the amount of co-dispersing liquid is less than about 60% by volume. In one embodiment, the amount of co-dispersing liquid is between about 5% to about 50% by volume. In one embodiment, the co-dispersing liquid comprises at least one alcohol. In one embodiment, the co-dispersing liquid comprises at least one member selected from the group of n-propanol, isopropanol, t-butanol, methanol, dimethylacetamide, dimethylformamide, N-methylpyrrolidone. The co-dispersing liquid can comprise an organic acid such as at least one member selected from the group consisting of p-toluenesulfonic acid, dodecylbenzenesulfonic acid, methanesulfonic acid, trifluoromethanesulfonic acid, camphorsulfonic acid, acetic acid, mixtures thereof and the like. Alternatively, the acid can comprise a water soluble polymeric acid such as poly(styrene-sulfonic acid), poly(2-acrylamido-2-methyl-1-propane-sulfonic acid), or the like, or a second colloid-forming acid, as described above. Combinations of acids can also be used.

The organic acid can be added to the polymerization mixture at any point in the process prior to the addition of either the oxidizer or the thienothiophene monomer, whichever is added last. In one embodiment, the organic acid is added before both the thienothiophene monomer and the colloid-forming polymeric acid, and the oxidizer is added last. In one embodiment the organic acid is added prior to the addition of the thienothiophene monomer, followed by the addition of the colloid-forming polymeric acid, and the oxidizer is added last. In another embodiment, the polymeric co-acid can be added to the aqueous dispersion after the as-synthesized aqueous dispersion has been treated with ion exchange resin(s). The co-dispersing liquid can be added to the polymerization mixture at any point prior to the addition of the oxidizer, catalyst, or monomer, whichever is last.

In another aspect of the invention, after completing any of the methods described above and completion of the polymerization, the as-synthesized aqueous dispersion is contacted with at least one ion exchange resin under conditions suitable to produce a stable, aqueous dispersion. In one embodiment, the as-synthesized aqueous dispersion is contacted with a first ion exchange resin and a second ion exchange resin. In another embodiment, the first ion exchange resin comprises an acidic, cation exchange resin, such as a sulfonic acid cation exchange resin set forth above, and the second ion exchange resin comprises a basic, anion exchange resin, such as a tertiary amine or a quaternary exchange resin.

Ion exchange comprises a reversible chemical reaction wherein an ion in a fluid medium (such as an aqueous dispersion) is exchanged for a similarly charged ion attached to an immobile solid particle that is insoluble in the fluid medium. The term "ion exchange resin" is used herein to refer to all such substances. The resin is rendered insoluble due to the crosslinked nature of the polymeric support to which the ion exchanging groups are attached. Ion exchange resins are classified as acidic, cation exchangers, which have positively charged mobile ions available for exchange, and basic, anion exchangers, whose exchangeable ions are negatively charged.

Both acidic, cation exchange resins and basic, anion exchange resins can be employed in the instant invention. In one embodiment, the acidic, cation exchange resin comprises an organic acid, cation exchange resin, such as a sulfonic acid cation exchange resin. Sulfonic acid cation exchange resins contemplated for use in the practice of the invention can comprise at least one member selected from the group consisting of sulfonated styrene-divinylbenzene copolymers, sulfonated crosslinked styrene polymers, phenol-formaldehyde-sulfonic acid resins, benzene-formaldehyde-sulfonic acid resins, and mixtures thereof. In another embodiment, the acidic, cation exchange resin comprises at least one organic acid, cation exchange resin, such as carboxylic acid, acrylic or phosphoric acid cation exchange resin and mixtures thereof. In addition, mixtures of different cation exchange resins can be used. In many cases, the basic ion exchange resin can be used to adjust the pH to the desired level. In some cases, the pH can be further adjusted with an aqueous basic solution such as a solution of sodium hydroxide, ammonium hydroxide, tetra-methylammonium hydroxide, calcium hydroxide, cesium hydroxide, and mixtures thereof, among others.

In another embodiment, the basic, anionic exchange resin comprises at least one tertiary amine anion exchange resin. Tertiary amine anion exchange resins contemplated for use in the practice of the invention can comprise at least one member selected from the group consisting of tertiary-aminated styrene-divinylbenzene copolymers, tertiary-aminated crosslinked styrene polymers, tertiary-aminated phenol-formaldehyde resins, tertiary-aminated benzene-formaldehyde resins, and mixtures thereof. In a further embodiment, the basic, anionic exchange resin comprises at least one quaternary amine anion exchange resin, or mixtures of these and among other exchange resins.

The first and second ion exchange resins may contact the as-synthesized aqueous dispersion either simultaneously, or consecutively. For example, in one embodiment both resins are added simultaneously to an as-synthesized aqueous dispersion comprising an electrically conducting polymer, and allowed to remain in contact with the dispersion for at least about 1 hour, e.g., about 2 hours to about 20 hours. The ion exchange resins can then be removed from the dispersion by filtration. This procedure can be repeated as desired in order to achieve a given ion concentration. The size of the filter is chosen so that the relatively large ion exchange resin particles will be removed while the smaller dispersion particles will pass through. Without wishing to be bound by theory or explanation, it is believed that the ion exchange resins quench polymerization and effectively remove ionic and non-ionic impurities and most of unreacted monomer from the as-synthesized aqueous dispersion. Moreover, the basic, anion exchange and/or acidic, cation exchange resins increases the pH of the dispersion. Generally, around 1-2 g of ion exchange resin per milli-equivalent oxidant is used to remove the oxidant. In one embodiment, 5-10 g of ion exchange resin is used per 1 g of $Fe_2(SO4)_3 \cdot H_2O$. In general, at least 1 gram of ion exchange resin is used per about 1 gram of colloid-forming polymeric acid. In one embodiment, about one gram of Lewatit® MP62 WS, a weakly basic anion exchange resin from Bayer GmbH, and about one gram of Lewatit® Mono-Plus S100, a strongly acidic, acid cation exchange resin from Bayer, GmbH, are used per gram of the composition of poly(thieno[3,4-b]thiophene) and at least one colloid-forming polymeric acid. Normally the pH of the dispersion ranges from about 1 to about 5.

In one embodiment, the aqueous dispersion resulting from polymerizing thieno[3,4-b]thiophene with or while in the presence of fluorinated polymeric sulfonic acid colloids is to charge a reaction vessel first with an aqueous dispersion comprising the fluorinated polymer. To the dispersion, in order, the oxidizer and thieno[3,4-b]thiophene monomer; or, in order, the thieno[3,4-b]thiophene monomer, and the oxidizer (e.g., in some cases, one material can function as an oxidant as well as a catalyst). The dispersion is mixed and polymerization is then allowed to proceed at a controlled temperature (e.g., mixed in order to maintain a dispersion). When polymerization is completed, the mixture is quenched with a strong acid cation resin and a base anion exchange resin, stirred and filtered. Alternatively, the thieno[3,4-b]thiophene can be added to water and dispersed prior to addition of Nafion® dispersion, followed with catalyst and/or oxidizer. The oxidizer:monomer molar ratio is about 0.05 to about 10, generally in the range of about 0.5 to about 5. The weight ratio of fluorinated polymer to thieno[3,4-b]thiophene monomer is about 1 to about 100, generally in the range of about 5 to about 50. The overall solid content is generally in the range of about 0.1% to about 10%; and in one embodiment about 2% to about 5%. The polymerization temperature is generally in the range of about 8° C. to about 95° C.; and in one embodiment about 15° C. to about 80° C. The polymerization time is generally in the range of about 1 to about 24 hours; and in one embodiment about 4 to about 6 hours.

As synthesized aqueous dispersions comprising polythienothiophenes polymer acid colloids comprising poly(thieno[3,4-b]thiophenes) and fluorinated polymeric sulfonic acid colloids, can have a wide range of pH and can be adjusted to typically be between about 1 and about 8, and generally have a pH of about 2 to about 3. It is frequently desirable to have a higher pH, as the acidity can be corrosive. It has been found that the pH can be adjusted using known techniques, for example, ion exchange or by titration with an aqueous basic solution. Aqueous dispersions of polythienothiophenes and other colloid-forming polymeric acids can be similarly treated to adjust the pH.

In another embodiment, more conductive dispersions are formed by adding highly conductive additives to the aqueous dispersions of poly(thieno[3,4-b]thiophene) and the colloid-forming polymeric acid. Because dispersions with relatively high pH can be formed, the conductive additives, especially metal additives, are usually not attacked by the acid in the dispersion. Moreover, because the polymeric acids are colloidal in nature, having the surfaces predominately containing acid groups, electrically conducting polythienothiophene can be formed on the colloidal surfaces. Because of this unique structure, a relatively low weight percentage of highly conductive additives, can be used, as desired, to reach the percolation threshold. Examples of suitable conductive additives can comprise at least one member selected from the group consisting of metal particles and nanoparticles, nanowires, carbon nanotubes, graphite fiber or particles, carbon particles and combinations thereof.

In another embodiment of the invention, there are provided hole injection layers aqueous dispersions comprising polythienothiophenes and colloid-forming polymeric acids, comprising as one embodiment poly(thieno[3,4-b]thiophene) and colloid-forming polymeric acids. In one embodiment, the hole injection layers are cast from aqueous dispersions comprising colloid-forming polymeric sulfonic acid (e.g., cast by spin coating, ink-jet printing, among other methods). In one embodiment, the hole injection layer is cast from an aqueous dispersion comprising poly(thieno[3,4-b]thiophene) and fluorinated polymeric acid colloids. In another embodiment, the fluorinated polymeric acid colloids are fluorinated polymeric sulfonic acid colloids. In still another embodiment, the hole injection layer is cast from an aqueous dispersion comprising poly(thieno[3,4-b]thiophene) and perfluoroethylenesulfonic acid colloids.

In one embodiment of the invention, the cast thin film or layer of the hole injection layer is annealed typically at elevated temperatures (e.g., up to about 250° C.). By "annealing" it is meant that the film is treated under conditions sufficient to increase the polymer repeat units (e.g., as measured by MALDI). Without wishing to be bound by any theory or explanation, annealing at elevated temperatures can increase the conductivity of the cast hole injection layer. MALDI-TOF mass spectroscopy measurements confirm that the number of repeat units in the conductive polymer chains increases after annealing. These improved properties of the annealed films result in improved device performance, such as higher brightness at the same voltage, and longer device lifetime. While any suitable annealing atmosphere can be employed, examples of suitable atmospheres comprise oxygen, nitrogen, among others.

Matrix assisted laser desorption/ionization (MALDI) time-of-flight (TOF) mass spectroscopy is used to determine the molecular weight of polythienothiophene chains in the conductive polymers synthesized in this invention. Films drop cast from the conductive polymer dispersions have been analyzed using MALDI mass spectroscopy. It has been found that after the films are treated at higher temperature (e.g., about 180 to 250 C), the number of the repeat units in the polythienothiophene chains increases. The results indicate that when the conductive polymer films are annealed at elevated temperatures, further polymerization occurs in the solid state, which increases the chain length of the conductive polymers.

In another embodiment, hole injection layers are cast from aqueous dispersions comprising polythienothiophene, comprising polymeric thieno[3,4-b]thiophene, and colloid-forming polymeric acids blended with additional water soluble or dispersible materials. Depending on the final application of the material, examples of additional water soluble or dispersible materials which can be added include, but are not limited to polymers, dyes, coating aids, carbon nanotubes, nanowires, surfactants (e.g., fluorosurfactants such as Zonyl® FSO series non-ionic fluorosurfactants (e.g., available commercially from DuPont) with structure RfCH2CH2O(CH2CH2O)xH, where Rf=F(CF2CF2)y, x=0 to about 15 and y=1 to about 7, acetylenic diol based surfactants such as Dynol™ and Surfynol® series (e.g., available commercially from Air Products and Chemicals, Inc), organic and inorganic conductive inks and pastes, charge transport materials, crosslinking agents, and combinations thereof. The materials can be simple molecules or polymers. Examples of suitable other water soluble or dispersible polymers comprise at least one conductive polymer such as polythiophenes, polyanilines, polyamines, polypyrroles, polyacetylenes, and combinations thereof.

In another embodiment, the invention relates to electronic devices comprising at least one electroactive layer (usually a semiconductor conjugated small molecule or polymer) positioned between two electrical contact layers, wherein at least one of the layers of the device includes the inventive hole injection layer. One embodiment of the present invention is illustrated by an OLED device, as shown in FIG. 1. Referring now to FIG. 1, FIG. 1 illustrates a device that comprises an anode layer 110, a hole injection layer 120, an electroluminescent layer 130, and a cathode layer 150. Adjacent to the cathode layer 150 is an optional electron-injection/transport layer 140. Between the hole injection layer 120 and the cathode layer 150 (or optional electron injection/transport layer 140) is the electroluminescent layer 130. Alternatively, a layer of hole transport and /or electron blocking layer, commonly termed interlayer, can be inserted between the hole injection layer 120 and the electroluminescent layer 130.

The device may include a support or substrate (not shown) that can be adjacent to the anode layer 110 or the cathode layer 150. Most frequently, the support is adjacent the anode layer 110. The support can be flexible or rigid, organic or inorganic. Generally, glass or flexible organic films are used as a support (e.g., a flexible organic film comprising poly(ethylene terephthalate), poly(ethylene naphthalene-2.6,-dicarboxylate), and polysulfone). The anode layer 110 comprises an electrode that is more efficient for injecting holes compared to the cathode layer 150. The anode can comprise materials containing a metal, mixed metal, alloy, metal oxide or mixed oxide. Suitable materials comprise at last one member selected from the group consisting of mixed oxides of the Group 2 elements (e.g., Be, Mg, Ca, Sr, Ba, Ra), the Group 11 elements, the elements in Groups 4, 5, and 6, and the Group 8-10 transition elements (The IUPAC number system is used throughout, where the groups from the Periodic Table are numbered from left to right as 1-18 [CRC Handbook of Chemistry and Physics, 81$^{st}$ Edition, 2000]). If the anode layer 110 is light transmitting, then mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, comprise at least one member selected from the group consisting of indium-tin-oxide ("ITO"), aluminum-tin-oxide, doped zinc oxide, gold, silver, copper, and nickel. The anode may also comprise a conductive organic material such as polyaniline, polythiophene or polypyrrole.

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include RF magnetron sputtering and inductively-coupled plasma physical vapor deposition ("IMP-PVD"). These deposition techniques are well known within the semiconductor fabrication arts.

The anode layer 110 may be patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used. When the electronic devices are located within an array, the anode layer 110 typically is formed into substantially parallel strips having lengths that extend in substantially the same direction.

The hole injection layer 120 is usually cast onto substrates using a variety of techniques well-known to those skilled in the art. Typical casting techniques include, for example, solution casting, drop casting, curtain casting, spin-coating, screen printing, inkjet printing, among others When the hole injection layer is applied by spin coating, the viscosity and solid contents of the dispersion, and the spin rate can be employed to adjust the resultant film thickness. Films applied by spin coating-are generally continuous and without pattern. Alternatively, the hole injection layer can be patterned using a number of depositing processes, such as ink jet-printing such as described in U.S. Pat. No. 6,087,196; hereby incorporated by reference.

The electroluminescent (EL) layer 130 may typically be a conjugated polymer, such as poly(paraphenylenevinylene), abbreviated as PPV, polyfluorene, spiropolyfluorene or other EL polymer material. The EL layer can also comprise relatively small molecules fluorescent or phosphorescent dye such as 8-hydroxyquinoline aluminum (Alq$_3$) and tris(2-(4-tolyl)phenylpyridine) Iridium (III), a dendrimer, a blend that contains the above-mentioned materials, and combinations. The EL layer can also comprise inorganic quantum dots or blends of semiconducting organic material with inorganic quantum dots. The particular material chosen may depend on the specific application, potentials used during operation, or other factors. The EL layer 130 containing the electroluminescent organic material can be applied from solutions by any conventional technique, including spin-coating, casting, and printing. The EL organic materials can be applied directly by vapor deposition processes, depending upon the nature of the materials. In another embodiment, an EL polymer precursor can be applied and then converted to the polymer, typically by heat or other source of external energy (e.g., visible light or UV radiation).

Optional layer 140 can function both to facilitate electron injection/transport, and can also serve as a confinement layer to prevent quenching reactions at layer interfaces. That is, layer 140 may promote electron mobility and reduce the likelihood of a quenching reaction that can occur when layers 130 and 150 are in direct contact. Examples of materials for optional layer 140 comprise at least one member selected from the group consisting of metal-chelated oxinoid compounds (e.g., $Alq_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)-4-phenyl-5-(4-t-butylphenyl)-1,2,4-triazole ("TAZ" or the like); other similar compounds; or any one or more combinations thereof. Alternatively, optional layer 140 may be inorganic and comprise BaO, CaO, LiF, CsF, NaCl, $Li_2O$, mixtures thereof, among others.

The cathode layer 150 comprises an electrode that is particularly efficient for injecting electrons or negative charge carriers. The cathode layer 150 can comprise any suitable metal or nonmetal having a lower work function than the first electrical contact layer (in this case, the anode layer 110). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs,), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 comprise at least one member selected from the group consisting of calcium, barium, lithium, cerium, cesium, europium, rubidium, yttrium, magnesium, samarium, and alloys and combinations thereof. When a reactive low work function metal such as Ca, Ba or Li is used, an overcoat of a more inert metal, such as silver or aluminum, can be used to protect the reactive metal and lower the cathode resistance.

The cathode layer 150 is usually formed by a chemical or physical vapor deposition process. In general, the cathode layer will be patterned, as discussed above in reference to the anode layer 110. If the device lies within an array, the cathode layer. 150 may be patterned into substantially parallel strips, where the lengths of the cathode layer strips extend in substantially the same direction and substantially perpendicular to the lengths of the anode layer strips. Electronic elements called pixels are formed at the cross points (where an anode layer strip intersects a cathode layer strip when the array is seen from a plan or top view). For top emitting devices, a very thin layer of low work function metal such as Ca and Ba combined with a thicker layer transparent conductor such as ITO can be used as transparent cathode. Top emitting devices are beneficial in active matrix display because larger aperture ratio can be realized. Examples of such devices are described in "Integration of Organic LED's and Amorphous Si TFT's onto Flexible and Lightweight Metal Foil Substrates"; by C. C. Wu et al; IEEE Electron Device Letters, Vol. 18, No. 12, December 1997, hereby incorporated by reference.

In other embodiments, additional layer(s) may be present within organic electronic devices. For example, a layer (not shown) between the hole injection layer 120 and the EL layer 130 may facilitate positive charge transport, energy-level matching of the layers, function as a protective layer, among other functions. Similarly, additional layers (not shown) between the EL layer 130 and the cathode layer 150 may facilitate negative charge transport, energy-level matching between the layers, function as a protective layer, among other functions. Layers that are known in the art can be also be included. In addition, any of the above-described layers can be made of two or more layers. Alternatively, some or all of inorganic anode layer 110, the hole injection layer 120, the EL layer 130, and cathode layer 150, may be surface treated to increase charge carrier transport efficiency. The choice of materials for each of the component layers may be determined by balancing the goals of providing a device with high device efficiency and longer device lifetime with the cost of manufacturing, manufacturing complexities, or potentially other factors.

The different layers may have any suitable thickness. Inorganic anode layer 110 is usually no greater than approximately 500 nm, for example, approximately 10-200 nm; hole injection layer 120, is usually no greater than approximately 300 nm, for example, approximately 30-200 nm; EL layer 130, is usually no greater than approximately 1000 nm, for example, approximately 30-500 nm; optional layer 140 is usually no greater than approximately 100 nm, for example, approximately 20-80 nm; and cathode layer 150 is usually no greater than approximately 300 nm, for example, approximately 1-150 nm. If the anode layer 110 or the cathode layer 150 needs to transmit at least some light, the thickness of such layer may not exceed approximately 150 nm.

Depending upon the application of the electronic device, the EL layer 130 can be a light-emitting layer that is activated by signal (such as in a light-emitting diode) or a layer of material that responds to radiant energy and generates a signal with or without an applied potential (such as detectors or photovoltaic cells). The light-emitting materials may be dispersed in a matrix of another material, with or without additives, and may form a layer alone. The EL layer 130 generally has a thickness in the range of approximately 30-500 nm.

Examples of other organic electronic devices that may benefit from having one or more layers comprising the aqueous dispersion comprising polythienothiophene made with polymeric acid colloids comprise: (1) devices that convert electrical energy into radiation (e.g., a light-emitting diode, light emitting diode display, or diode laser), (2) devices that detect signals through electronics processes (e.g., photodetectors (e.g., photoconductive cells, photoresistors, photoswitches, phototransistors, phototubes), IR detectors), (3) devices that convert radiation into electrical energy, (e.g., a photovoltaic device or solar cell), and (4) devices that include one or more electronic components that include one or more organic semi-conductor layers (e.g., a transistor or diode).

Organic light emitting diodes (OLEDs) inject electrons and holes from the cathode 150 and anode 110 layers, respectively, into the EL layer 130, and form negative and positively charged polarons in the polymer. These polarons migrate under the influence of the applied electric field, forming an exciton with an oppositely charged polarons and subsequently undergoing radiative recombination. A sufficient potential difference between the anode and cathode, usually less than approximately 12 volts, and in many instances no greater than approximately 5 volts, may be applied to the device. The actual potential difference may depend on the use of the device in a larger electronic component. In many embodiments, the anode layer 110 is biased to a positive voltage and the cathode layer 150 is at substantially ground potential or zero volts during the operation of the electronic device. A battery or other power source(s), not shown, may be electrically connected to the electronic device as part of a circuit.

OLEDs provided with hole injection layers cast from aqueous dispersions comprising polymeric thieno[3,4-b]thiophenes and colloid-forming polymeric acids have been found to have improved lifetimes, with much slower brightness decrease and voltage increase. The hole injection layer may be cast from an aqueous dispersion obtained by combining poly(thieno[3,4-b]thiophene) and fluorinated polymeric sulfonic acid colloids; and in one embodiment comprises an aqueous dispersion in which the pH could be adjusted to above about 3.5 (e.g., by adding a basic compound such as sodium hydroxide or cesium hydroxide).

The instant invention permits using a less acidic or pH neutral material which can lead to significantly less etching of the ITO layer during device fabrication and in turn reduce the concentration of In and Sn ions diffusing into the polymer layers of the OLED. Without wishing to be bound by any theory or explanation, it is believed that In and Sn ions can contribute to reduced operating lifetime. The lower acidity also reduces corrosion of the metal components of the display (e.g. electrical contact pads) during fabrication and over the long-term storage. The instant invention also eliminates the presence of PEDOT/PSSA residues which can interact with residual moisture to release acid into the displays with resulting slow corrosion.

Equipment used to dispense the acidic PEDOT/PSSA needs to be specially designed to handle the relatively strong acidity of PEDOT/PSSA. For example, a chrome-plated slot-die coating-head used to coat the PEDOT/PSSA onto ITO substrates was found to be corroding due to the acidity of the PEDOT/PSSA. This rendered the head unusable since the coated film became contaminated with particles of chrome. PEDOT/PSSA systems also adversely affect certain ink-jet print heads that can be used for fabricating OLED displays. They are used for dispensing both the hole injection layer and the light-emitting polymer layer in precise locations on the display. These print-heads contain nickel mesh filters as an internal trap for particles in the ink. The nickel filters are decomposed by the acidic PEDOT/PSSA and rendered unusable. These corrosion problems can be reduced, if not eliminated by using the aqueous poly(thieno[3,4-b]thiophene) dispersions of the invention.

Furthermore, certain light-emitting polymers are found to be sensitive to acidic conditions, and their light-emitting capability is degraded if they are in contact with an acidic hole injection layer. It is advantageous to use the inventive aqueous poly(thieno[3,4-b]thiophene) dispersions to form the hole injection layer because of the lower acidity or neutrality.

The fabrication of full-color or area-color displays using two or more different light-emitting materials becomes complicated if each light-emitting material requires a different cathode material to optimize its performance. Display devices typically comprise a multiplicity of pixels which emit light. In multicolor devices, at least two different types of pixels (sometimes referred to as sub-pixels) are emitting light of different colors. The sub-pixels are constructed with different light-emitting materials. It is desirable to have a single cathode material that gives good device performance with all of the light emitters. This minimizes the complexity of the device fabrication. It has been found that a common cathode can be used in multicolor devices where the hole injection layer is made from the inventive aqueous poly(thieno[3,4-b]thiophene). The cathode can be made from any of the materials discussed above; and may be barium, overcoated with a more inert metal such as silver or aluminum.

Other organic electronic devices that may benefit from having one or more layers comprising an aqueous dispersion of polythienothiophene, including poly(thieno[3,4-b]thiophene), and at least one colloid-forming polymeric acids include: (1) devices that convert electrical energy into radiation (e.g., a light-emitting diode, light emitting diode display, or diode laser), (2) devices that detect signals through electronics processes (e.g., photodetectors (e.g., photoconductive cells, photoresistors, photoswitches, phototransistors, phototubes), IR detectors), (3) devices that convert radiation into electrical energy, (e.g., a photovoltaic device or solar cell), and (4) devices that include one or more electronic components that include one or more organic semi-conductor layers (e.g., a transistor or diode).

If desired, the hole injection layer can be overcoated with a layer of conductive polymer applied from aqueous solution or solvent. The conductive polymer can facilitate charge transfer and also improve coatability. Examples of suitable conductive polymers comprise at least one member selected from the group consisting of polyanilines, polythiophenes, polypyrroles, polyacetylenes, polythienothiophene/polystyrenesulfonic acid, polydioxythiophene/polystyrenesulfonic acid, polyaniline-polymeric-acid-colloids, PEDOT-polymeric-acid-colloids and combinations thereof.

In yet another embodiment, the invention relates to thin film field effect transistors comprising electrodes comprising poly(thieno[3,4-b]thiophenes) and colloid-forming polymeric sulfonic acids. For use as electrodes in thin film field effect transistors, the conducting polymers and the liquids for dispersing or dissolving the conducting polymers are compatible with the semiconducting polymers and the solvents (e.g., to prevent re-dissolution of the polymers or semiconducting polymers). Thin film field effect transistor electrodes fabricated from conducting polymers should have a conductivity greater than about 10 S/cm. However, electrically conducting polymers made with water soluble polymeric acids usually provide conductivity in the range of about $10^{-3}$ S/cm or lower. Thus, in one embodiment of the invention, the electrodes comprise poly(thieno[3,4-b]thiophene) and fluorinated colloid-forming polymeric sulfonic acids in combination with electrical conductivity enhancers such as nanowires, carbon nanotubes, among others. In still another embodiment of the invention, the electrodes comprise poly(thieno[3,4-b]thiophene) and colloid-forming perfluoroethylenesulfonic acid in combination with electrical conductivity enhancers such as nanowires, carbon nanotubes, among others. Inventive compositions may be used in thin film field effect transistors as gate electrodes, drain electrodes, or source electrodes.

Figure 2:
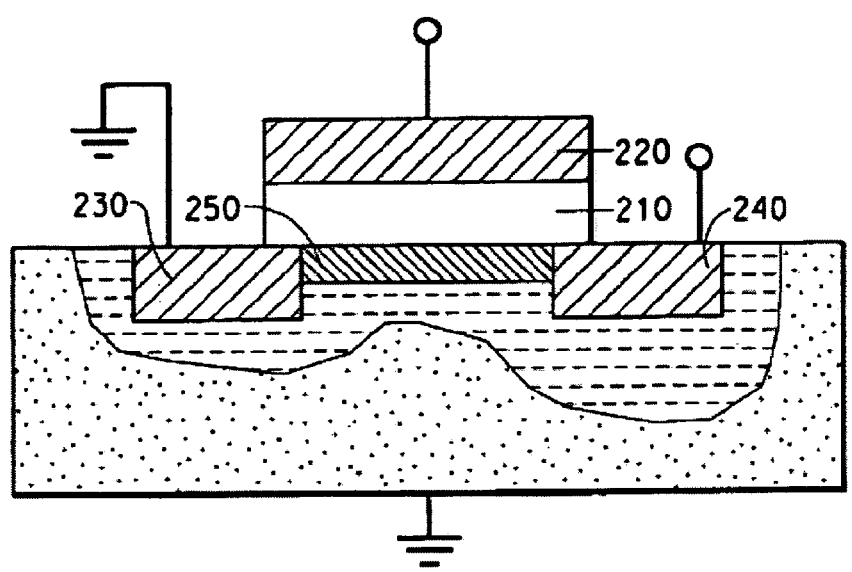
FIG. 2 illustrates a cross-sectional view of a thin film field effect transistor that includes an electrode according to the invention.

Another aspect of the instant invention comprises a thin film field effect transistor such as shown in FIG. 2. Referring now to FIG. 2, FIG. 2 illustrates a dielectric polymer or dielectric oxide thin film 210 has a gate electrode 220 on one side and drain and source electrodes, 230 and 240, respectively, on the other side. Between the drain and source electrode, an organic semiconducting film 250 is deposited. The inventive aqueous dispersions containing nanowires or carbon nanotubes are ideal for the applications of gate, drain and source electrodes because of their compatibility with organic based dielectric polymers and semiconducting polymers in solution thin film deposition. Since the inventive conducting compositions, e.g., in one embodiment polythienothiophene and colloidal perfluoroethylene sulfonic acid, can exist as a colloidal dispersion, less weight percentage of the conductive fillers is required (relative to compositions containing water soluble polymeric sulfonic acids) to reach percolation threshold for high electrical conductivity.

In organic thin film transistor (OTFT) devices, charge injection from source electrode to the channel material can be limited due to the mismatch of the work function of the electrode and the energy level of the channel material, which results in a significant voltage drop at the contact between the electrode and the channel material. As a result, apparent charge mobility becomes low, and the OTFT device can only pass low current. Similar to the application as hole injection layer in OLED, a thin layer of the inventive conductive polymer film can be applied between the source electrode and the channel material of an OTFT device, to improve the energy level match, reduce the contact voltage drop and improve charge injection. As a result, higher current and higher charge mobility can be achieved in the OTFT device.

In still another embodiment of the invention relates methods for producing, aqueous dispersions of polythienothiophene comprising polymerizing thienothiophene monomers in the presence of polymeric sulfonic acid colloids. In one embodiment of the inventive methods, the polythienothiophene comprises a poly(thieno[3,4-b]thiophene) and the colloid-forming polymeric sulfonic acid is fluorinated. In another embodiment of the inventive methods, the polythienothiophene comprise poly(thieno[3,4-b]thiophene) and the colloid-forming polymeric sulfonic acid is perfluorinated. In still another embodiment, the colloid-forming polymeric sulfonic acid comprises perfluoroethylenesulfonic acid. The polymerization is carried out in the presence of water. The resulting mixture can be treated with ion exchange resins to remove byproducts.

The invention will now be described in greater detail by reference to the following non-limiting examples. The following examples described certain embodiments of the instant invention and shall not limit the scope of the claims appended hereto.

Example 1

Dispersion A 0.0575 grams (0.111 mmol) of ferric sulfate hydrate (97%, Sigma-Aldrich Chemical Co) and 0.135 grams (0.515 mmol) potassium persulfate (99+%, Fisher Scientific Co.) were added to a 60 ml jacketed reaction flask with 44.53 g of deionized water. The system was mixed for 5 minutes until the solids were dissolved. 15.47 grams (1.406 meq) of 10% Nafion® dispersion in water (obtained from Aldrich Chemical Co.) was added to the reactor. The reactor is completely filled with the reaction mixture. The jacketed flask was adjusted to maintain a 16° C. reaction temperature. 0.0807 g (0.576 mmol) of thieno[3,4-b]thiophene was added to the reaction mixture. During the polymerization the contents of the reactor were well mixed to ensure a stable dispersion. The reaction mass quickly turned from light green to emerald green to opaque dark blue within 20 minutes. Polymerization was allowed to proceed for 4 hrs after the introduction of monomer. The reaction product was purified by means of cationic resin, Amberlite® IR-120(plus) and anionic ion exchange resin, Lewatit® MP62.

Dispersion B 15 g of Dispersion A was purified by passing sequentially through 2.8 g of Amberlite® IR-120 cation exchange resin (Sigma-Aldrich Chemical Co) and 2.8 g of Lewatit® MP-62 anion exchange resin (Fluka, Sigma-Aldrich Chemical Co), resulting in an opaque dark blue aqueous poly(thieno[3,4-b]thiophene)/Nafion® dispersion.

The dispersion was analyzed for residual metal ions by inductively coupled plasma-mass spectrometry (ICP-MS) with the following ions detected: Al (<=7 ppm); Ba (<1 ppm); Ca (<20 ppm); Cr (<1 ppm), Fe (<=2 ppm); Mg (<3 ppm); Mn (<1 ppm); Ni (<4 ppm); Zn (<5 ppm); Na (<2 ppm); K (<1 ppm).

Dispersion C

Separately, 15 grams of Dispersion A was purified by adding 5.0 g of Amberlite® IR-120 and 5.0 g Lewatit® MP-62 ion exchange resins, resulting in a slurry of opaque dark blue aqueous poly(thieno[3,4-b]thiophene)/Nafion dispersion with the resins. The slurry was filtered through 0.45 micron filter to separate the ion exchange resin from the purified dispersion after overnight exchange.

The dispersion was analyzed for residual metal ions by ICP-MS with the following ions detected: Al (<=7 ppm); Ba (<1 ppm); Ca (<20 ppm); Cr (<1 ppm), Fe (86 ppm); Mg (5 ppm); Mn (<1 ppm); Ni (<=7 ppm); Zn (<5 ppm); Na (<2 ppm); K (59 ppm).

Dispersion D

The remaining 30 grams of Dispersion A slurry was filtered through a 5.0 um filter to separate the ion exchange resin from the purified dispersion after overnight exchange.

The dispersion was analyzed for residual metal ions by ICP-MS with the following ions detected: Al (<3 ppm); Ba (<1 ppm); Ca (<20 ppm); Cr (<1 ppm), Fe (96 ppm); Mg (6 ppm); Mn (<1 ppm); Ni (<=9 ppm); Zn (<5 ppm); Na (<2 ppm); K (91 ppm).

Dispersion E 217 grams of deionized water was added to a 500 ml jacketed reactor. 79.87 grams (72.6 meq) of a 10% Nafion® dispersion in water (Aldrich Chemical Co.) was added to the reactor and mixed for 5 minutes with an overhead stirrer. The jacketed flask was adjusted to maintain a 16° C. reaction temperature. 0.7973 grams (5.7 mmol) of thieno[3,4-b]thiophene was separately co-fed into the reactor with 3.3 grams (6.4 mmole) of $Fe_2(SO_4)_3 \cdot H_2O$ dissolved in 52.3 grams of deionized water. The reaction mass turned from light green to emerald green to dark blue within 20 minutesPolymerization was allowed to proceed for 4 hours after the introduction of monomer and oxidant. The resulting dispersion was then purified by adding the contents of the reactor to a 500 ml Nalgene® bottle containing 17.5 grams of Amberlite® IR-120 cation exchange resin (Sigma-Aldrich Chemical Co) and 17.5 grams of Lewatit® MP-62 anion exchange resin (Fluka, Sigma-Aldrich Chemical Co), resulting in an opaque dark blue aqueous poly(thieno[3,4-b]thiophene)/Nafion® dispersion. The dispersion was filtered sequentially through 10, 5, 0.65 and 0.45 micron pore size filters.

The dispersion was analyzed for residual metal ions by ICP-MS with the following ions being detected: Al (<1 ppm); Ba (<1 ppm); Ca (<20 ppm); Cr (<1 ppm), Fe (156 ppm); Mg (<1 ppm); Mn (<1 ppm); Ni (<1 ppm); Zn (<1 ppm); Na (3 ppm); K (<1 ppm).

Comparison Example

For device performance comparison, a dispersion of poly(thieno[3,4-b]thiophene) was made using poly(styrene sulfonic acid) as the polymeric counter ion/dopant/dispersant according to U.S. Patent Application Publication No. US2005-0151122-A1; hereby incorporated by reference. The dispersion is referred to as PTT:PSSA Conductivity and Filterability Dispersion B is filterable using a PVDF filter with pore size of 0.45 micron. Drop cast film of Dispersion B (0.5 mL on 1 inch by 1 inch glass substrate) produced a film with conductivity of $2.56 \times 10^{-2}$ S/cm after being annealed at 180° C. for 15 min under nitrogen. The conductivity of as-dropped film before annealing was $9.03 \times 10^{-7}$ S/cm. The conductivities were measured in an argon filled glove box using four-point probe method.

Dispersion C is filterable using a PVDF filter with pore size of 0.45 micron. Drop cast film of Dispersion C (0.5 mL on 1 inch by 1 inch glass substrate) produced a film with conductivity of $1.77 \times 10^{-3}$ S/cm after being annealed at 180° C. for 15 min under nitrogen. The conductivity of as-dropped film before annealing was $6.32 \times 10^{-7}$ S/cm. The conductivities were measured in an argon filled glove box using four-point probe method.

Dispersion D is filterable using a PVDF filter with pore size of 0.45 micron. Drop cast film of Dispersion D (0.5 mL on 1 inch by 1 inch glass substrate) yield a film with conductivity of $1.26 \times 10^{-1}$ S/cm after being annealed at 180° C. for 15 min under nitrogen. The conductivity of as-dropped film before annealing was $7.92 \times 10^{-7}$ S/cm. The conductivities were measured in an argon filled glove box using four-point probe method.

DEVICE EXAMPLES

Example 2

A light emitting polymer solution of MEH-PPV (poly(2-methoxy, 5-(2'-ethyl-hexyloxy)-p-phenylene-vinylene), ADS130RE from American Dye Source, Inc. in Baie D'Urfe, Quebec, Canada) in toluene was prepared by dissolving 19.8 mg of MEH-PPV in 2.84 g of toluene on a hot plate at 60° C. for 2 hr, and then filtered with a 0.45 µm PVDF filter. The solution is hereafter referred as Solution A. The device obtained by this Example is illustrated in FIG. 2 but without the optional layer 140.

Figure 3:
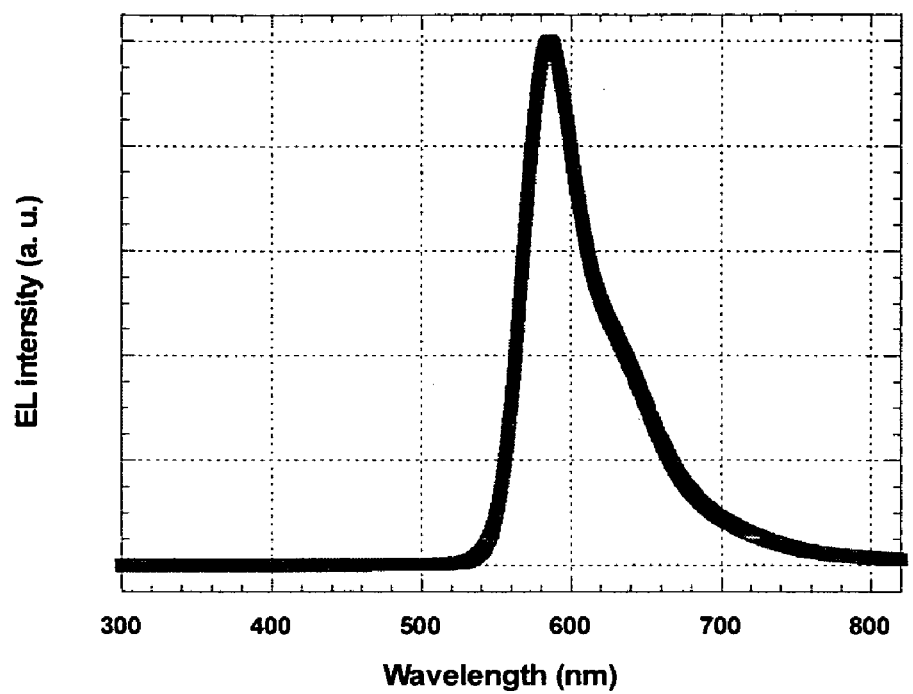
FIG. 3 illustrates the EL spectrum of OLED in Example 2.

An indium tin oxide coated glass substrate (2.5×2.5×0.7 cm, surface resistance ~12 Ω/square) was cleaned by ultrasonication sequentially in de-ionized water with detergent, de-ionized water, methanol, isopropanol, and acetone; each for 5 to 10 min. The ITO substrate was allowed to dry between different cleaning solvents. Then the ITO substrate was treated with oxygen plasma in an SPI Prep II plasma etcher for about 10 min. After that, the ITO substrate was spin coated with Dispersion B at 1500 rpm for 1 min on a Laurell Model WS-400-N6PP spinner. Dispersion B was filtered with a 0.45 micron PVDF filter before spin coating. A uniform film of PTT:Nafion was obtained. The thickness of the PTT:Nafion layer was about 40 nm. The PTT coated ITO substrate was annealed at 130° C. for 15 min under nitrogen protection. Then a layer of about 60-nm-thick MEH-PPV was spin coated onto the PTT:Nafion hole injection/transporting layer from Solution A at a spin rate of 2000 rpm. The sample was then transferred into the chamber of a vacuum evaporator, which was located inside an argon atmosphere glove box. A layer of 20 nm thick Ca was vacuum deposited at below $1 \times 10^{-7}$ Torr through a mask at a rate of 1.5~3.0 Å/s, and another layer of 120 nm thick Ag was vacuum deposited on top of the Ca layer at a deposition rate of ~3.0 Å/s. The active area of the device was about 6.2 mm². The LED device was then moved out of the glove box for testing in air at room temperature. Thicknesses were measured on a KLA Tencor P-15 Profiler. Current-voltage characteristics were measured on a Keithley 2400 SourceMeter. Electroluminescence (EL) spectrum of the device was measured using an Oriel InstaSpec IV CCD camera and is illustrated in FIG. 3. The power of EL emission was measured using a Newport 2835-C multi-function optical meter in conjunction with a calibrated Si photodiode. Brightness was calculated using the EL forward output power and the EL spectrum of the device, assuming Lambertian distribution of the EL emission, and verified with a Photo Research PR650 colorimeter. The device reached 1 cd/m² at about 2.4 V. The maximum external quantum efficiency was 0.60%. At a current density of 100 mA/cm², the device showed a brightness of 1,290 cd/m². At a current density of 1000 mA/cm², the brightness was 13,400 cd/m².

Example 3

Figure 4:
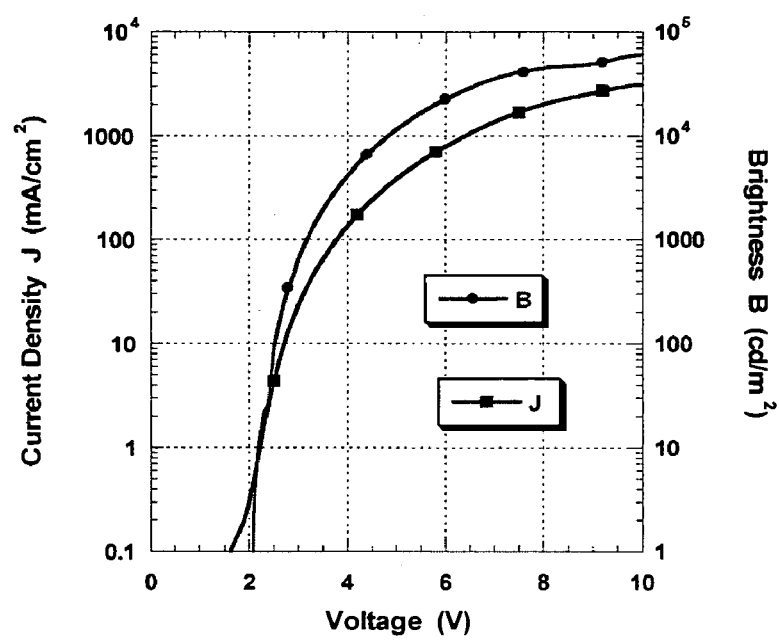
FIG. 4 illustrates the current density-voltage-brightness curves of OLED device in Example 3.

An OLED device was made the same way as in Example 2, using Dispersion C as the hole injection/transporting layer. Dispersion C was filtered with a 0.45 micron pore size PVDF filter before spin coating. A uniform film of PTT:Nafion with thickness of about 78 nm was obtained at spin rate of 1500 rpm. The structure of this device is illustrated in FIG. 2 without optional layer 140. The device reached 1 cd/m² at about 2.1 V, with a maximum external quantum efficiency of 1.26%. At a current density of 100 mA/cm², the device showed a brightness of 3,040 cd/m². At a current density of 1000 mA/cm², the brightness was 26,400 cd/m². The performance results of operating a device obtained by this Example are shown in FIG. 4.

Example 4

A solution was prepared by dissolving 66.2 mg poly(N-vinylcarbazole) (from Aldrich Chemical Company, Inc in Milwaukee, Wis., USA), 38.7 mg 2-(4-biphenylyl)-5-(4-tert-butylphenyl)-1,3,4-oxadiazole (from Aldrich Chemical Company, Inc.), 24.8 mg of N,N'-Bis(3-methylphenyl)-N,N'-diphenylbenzidine (from Aldrich Chemical Company, Inc.) and 8.5 mg of triplet emitter tris(2-(4-tolyl)phenylpyridine) iridium (III) (from American Dye Source, Inc.) in 5.38 g chlorobenzene. The solution was heated on a hot plate at 60° C. for 2 hr and then filtered with a 0.2 micron filter and hereafter referred as Solution B. Solution C was prepared by adding 0.5 mL of chlorobenzene into 1.0 mL of Solution B and used for device fabrication.

An OLED device was prepared using Dispersion B as the HIL. The structure of this device is illustrated in FIG. 2 without optional layer 140. The HIL of Disperion B was fabricated the same way as in Example 2. After the layer was annealed at 130° C. for 15 min, a light emitting layer was spin coated from Solution C at 2000 rpm. The rest of device fabrication and device testing were carried out the same way as in Example 2. The device reached 1 cd/m² at about 5.6 V, with a maximum external quantum efficiency of 1.84%. At a current density of 100 mA/cm², the device showed a brightness of 4,450 cd/m². At a current density of 1000 mA/cm², the brightness was 51,500 cd/m².

Example 5

An OLED device was made the same way as in Example 4, using Dispersion C as the hole injection/transporting layer. The structure of this device is illustrated in FIG. 2 without optional layer 140. The device reached 1 cd/m² at about 5.9 V, with a maximum external quantum efficiency of 2.02%. At a current density of 100 mA/cm², the device showed a brightness of 6,630 cd/m². At a current density of 1000 mA/cm², the brightness was 48,900 cd/m².

Example 6

Figure 5:
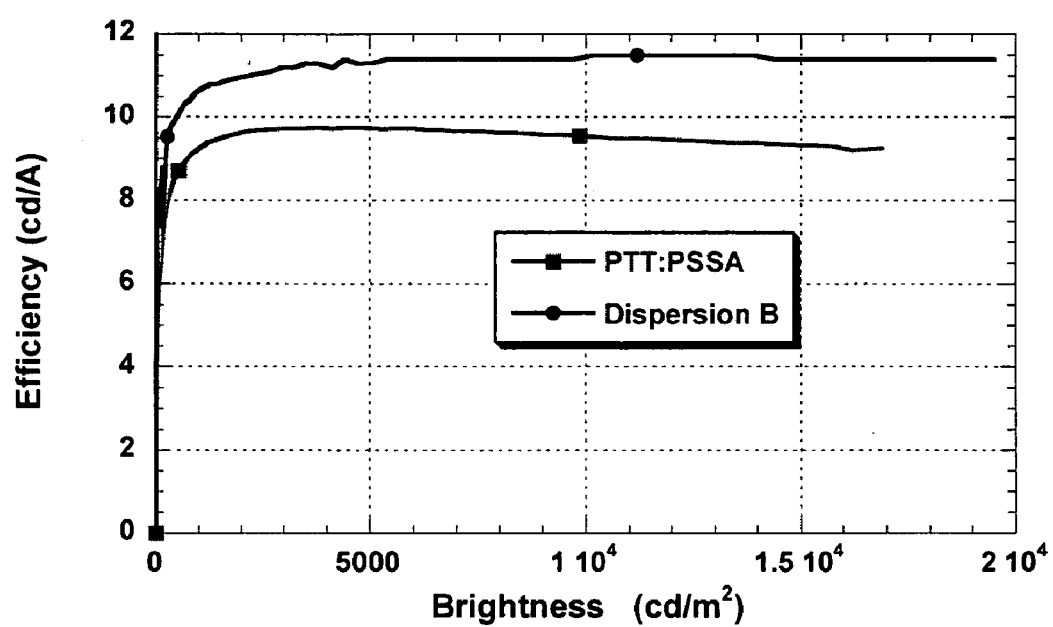
FIG. 5 illustrates efficiency vs. brightness of devices in Example 6
Figure 6:
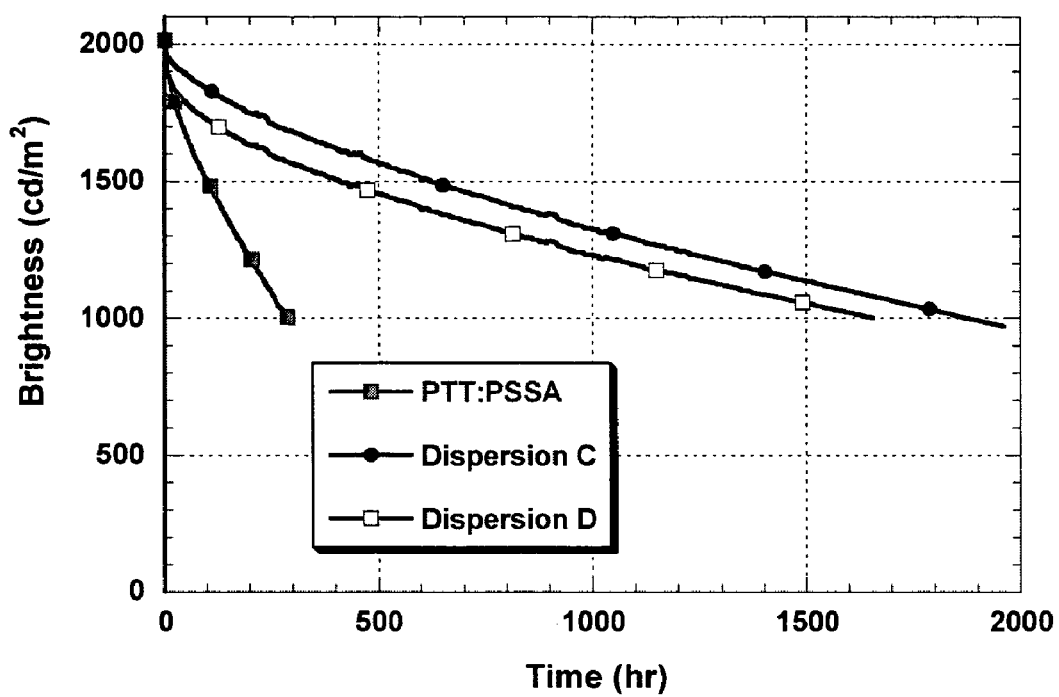
FIG. 6 illustrates lifetime (brightness vs time) of devices in Example 6.
Figure 7:
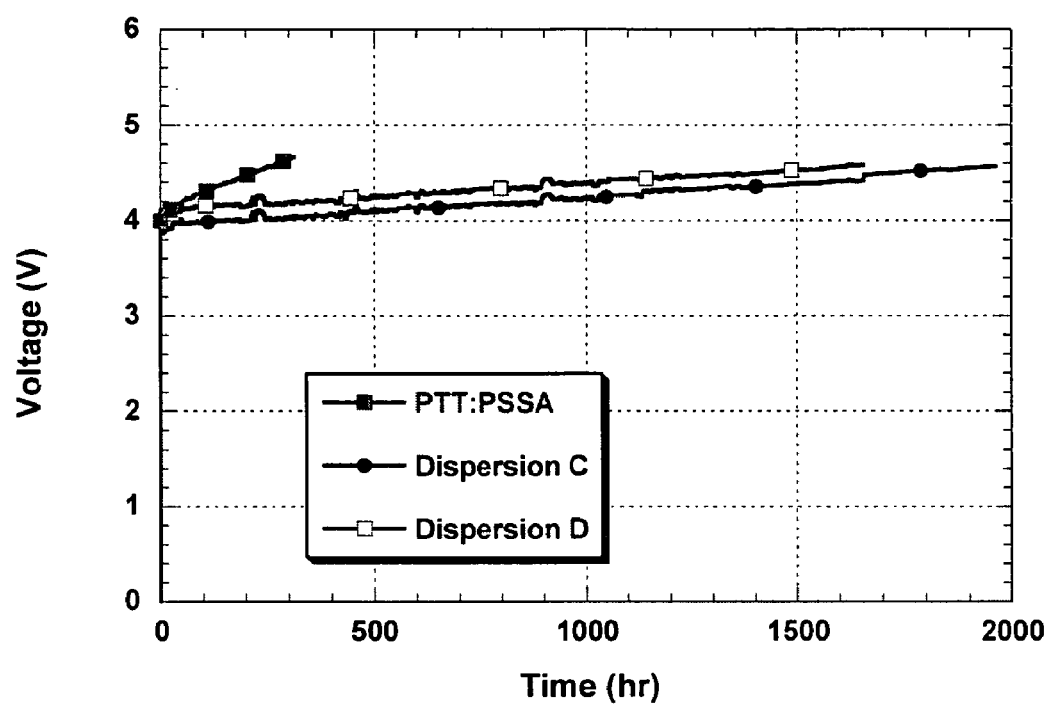
FIG. 7 illustrates voltage change as a function of time for devices in Example 6.

3 patterned ITO substrates with surface resistance of 10-15 ohm/square were cleaned in the same manner as in Example 2. The ITO substrates were then spin coated, respectively, at a spin rate of 1500 rpm, with Dispersion C, Dispersion D, and a PTT:PSSA dispersion that was produced according to the procedure disclosed in U.S. Patent Application Publication No. US2005-0151122-A1; hereby incorporated by reference. The ITO substrates were then annealed at 180 to 200° C. for 15 min. After the annealing, a layer of about 80-nm-thick LUMATION Green 1304 (supplied by Sumitomo Chemical Company) was spin coated from toluene solution. The samples were then baked at 130° C. for 20 min on a hotplate under $N_2$ protection. The samples were then transferred into the chamber of a vacuum evaporator, which was located inside an argon atmosphere glove box. A layer of 5 nm thick Ba was vacuum deposited at below $1\times10^{-7}$ Torr through a mask at a rate of ~1.5 Å/s, and another layer of 120 nm thick Ag was vacuum deposited on top of the Ba layer at a deposition rate of ~3.0-4.0 Å/s. The devices were then encapsulated with glass cover lid and UV curable epoxy in the argon glove box. The devices were taken out of the glove box and then measured for IV curves and brightness as in Example 2. The efficiencies of the devices were shown in FIG. 5. After the characterization, the devices were then put on a CDT Eclipse PLED Lifetime Tester for DC lifetime test at an initial brightness of 2000 cd/m². FIG. 6 shows the lifetime test results. The devices using Dispersions C and D showed significantly longer lifetime compared with the device using PTT:PSSA as the hole injection layer. The device half life is defined as the time it takes for the brightness of the device to reach 50% of the initial value of 2000 cd/m², i.e. 1000 cd/m². The device half lifes were 289 hr for the PTT:PSSA device, and 1870 and 1650 hr for the PTT:Nafion® Dispersion C and Dispersion D PTT:Nafion® based devices. As shown in FIG. 7, the operation voltages of the devices using Dispersions C and D were much more stable compared with that of the device using PTT:PSSA as the hole injection layer. The voltage increasing rate for PTT:PSSA device was 0.6 V in 289 hr. The voltage increasing rates were 0.6 V in 1870 hr and 0.5 V in 1650 hr, for the PTT:Nafion® Dispersion C and Dispersion D based devices.

Example 7

Figure 8:
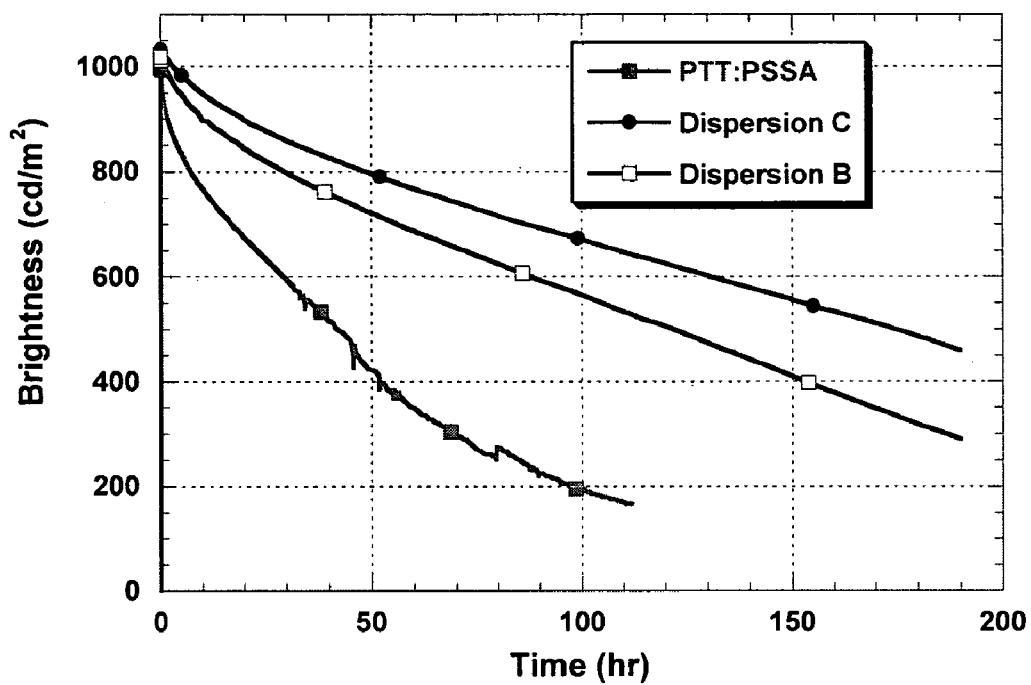
FIG. 8 illustrates lifetime (brightness vs time) of devices in Example 7.
Figure 9:
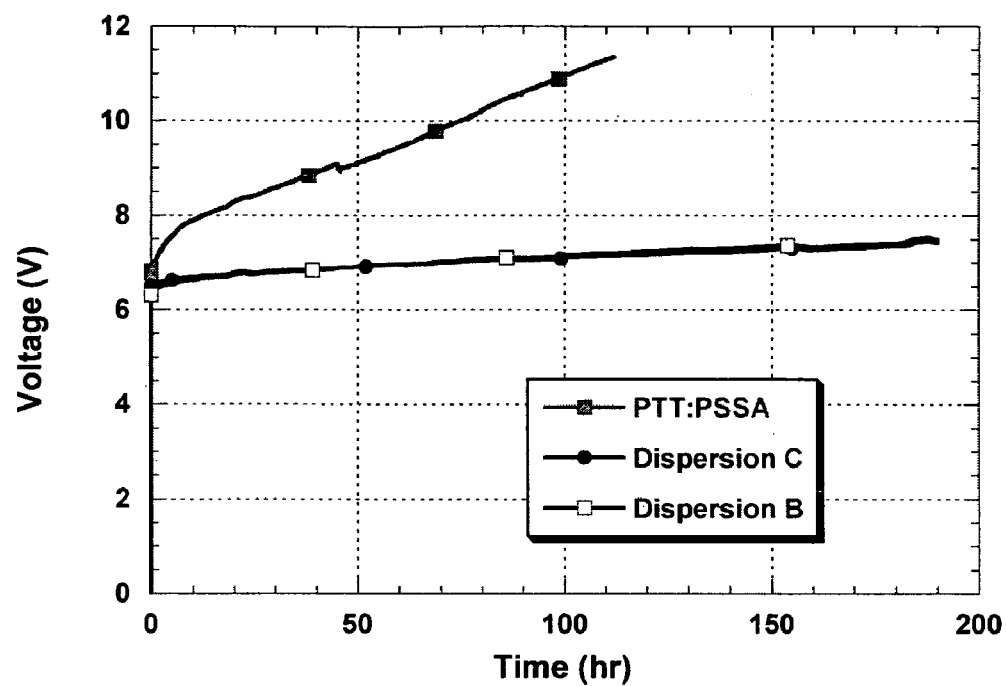
FIG. 9 illustrates voltage change as a function of time for devices in Example 7.
Figure 10:
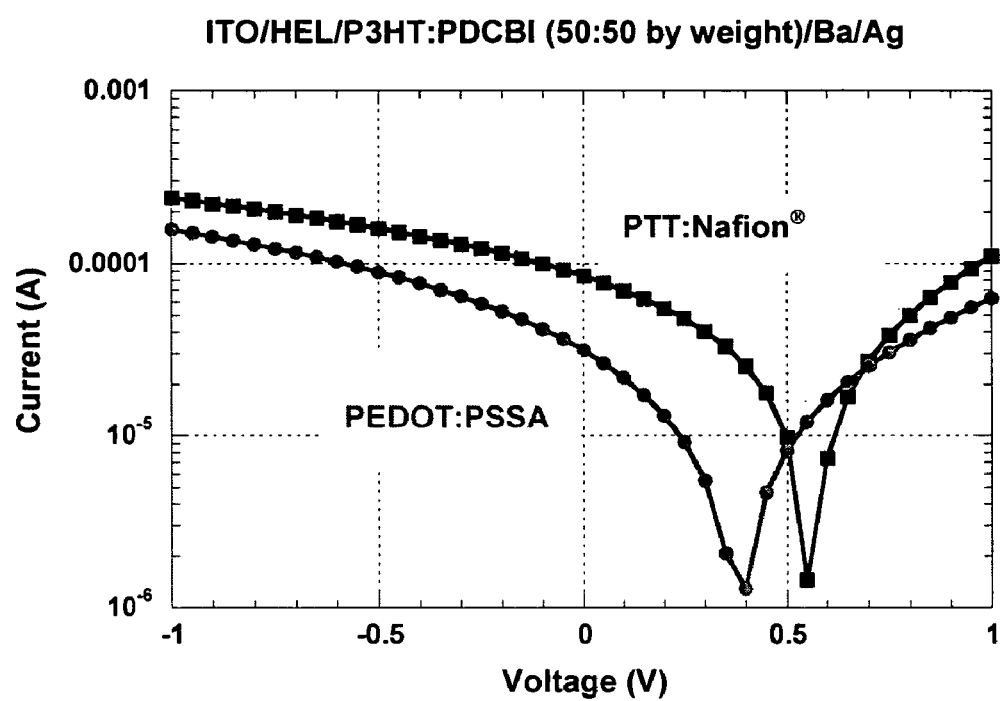
FIG. 10 illustrates the current-voltage characteristics for OPVDs in Example 8.

3 patterned ITO substrates with surface resistance of 10-15 ohm/square were cleaned in the same manner as in Example 2. The ITO substrates were then spin coated, respectively, at a spin rate of 1500 rpm with Dispersion B, Dispersion C, and a PTT:PSSA dispersion that was produced according to the procedure disclosed in U.S. Patent Application Publication No. US2005-0151122-A1; hereby incorporated by reference. The ITO substrates were then annealed at 180 to 200° C. for 15 min. After the annealing, a layer of about 80-nm-thick LUMATION Blue LEP light emitting polymer (supplied by Sumitomo Chemical Company) was spin coated from toluene solution. The samples were then baked at 130° C. for 20 min on a hotplate under $N_2$ protection. The samples were then transferred into the chamber of a vacuum evaporator, which was located inside an argon atmosphere glove box. A layer of 5 nm thick Ba was vacuum deposited at below $1\times10^{-7}$ Torr through a mask at a rate of ~1.5 Å/s, and another layer of 120 nm thick Ag was vacuum deposited on top of the Ba layer at a deposition rate of ~3.0-4.0 Å/s. The devices were then encapsulated with glass cover lid and UV curable epoxy in the argon glove box. The devices were then taken out of the glove box and measured for IV curves and brightness as in Example 2. After the characterization, the devices were then put on a CDT Eclipse PLED Lifetime Tester for DC lifetime test at an initial brightness of 1000 cd/m². FIG. 8 shows the lifetime test results. The devices using Dispersions C and B showed significantly longer lifetime compared with the device using PTT:PSSA as the hole injection layer. The device half lifes were 42 hr for the PTT:PSSA device, and 122 and 175 hr for the PTT:Nafion Dispersion B and Dispersion C based devices. As shown in FIG. 9, the operation voltages of the devices using the PTT:Nafion® Dispersions C and D were much more stable compared with that of the device using PTT:PSSA as the hole injection layer. The voltage increasing rate for PTT:PSSA device was 2.3 V in 42 hr. The voltage increasing rates were 0.9 V in 122 hr and 0.8 V in 175 hr, for the PTT:Nafion® Dispersion B and Dispersion C based devices.

Example 8

A solution of regioregular poly(3-hexylthiophene) (P3HT, from Riek Metals, Inc) and N,N'-bis(2,5-di-tert-butylphenyl)-3,4,9,10-perylenedicarboximide (PDCBI, from Sigma-Aldrich) as the hole and the electron transporting material was prepared by dissolving 8.4 mg of P3HT and 8.9 mg of PDCBI in 1.0 g chlorobenzene. The solution was filtered with a PTFE filter with pore size of 0.2 micron. The solution is referenced herein as Solution E. PV devices were fabricated using patterned ITO substrates as the positive electrode and Ba as the negative electrode. The ITO substrates were cleaned in DI water with detergent, and methanol and isopropanol with ultrasonic cleaner. After solvent cleaning, the ITO substrates were cleaned with oxygen plasma in an SPI Desktop II oxygen plasma etcher for 10 min. For the hole extraction layer (HEL), either PTT:Nafion® synthesized in Example 1 or Baytron P AI4083 (poly(ethylene-3,4-dioxythiophene): poly (styrene sulfonic acid) (PEDOT:PSSA, from Bayer) was spin coated at a spin rate of 1500 rpm from its water dispersion and cured at 180° C. for 15 min in air. The PTT:Nafion® and PEDOT:PSSA dispersions were filtered with a 0.45 micron PVDF filter prior to spin coating. After annealing, a layer of the P3HT:PDCBI blend was spin coated from Solution E onto the HEL at a spin rate of 2000 rpm for 1 min. The samples were then masked and transferred into the chamber of a vacuum evaporator located inside an argon atmosphere dry box. A layer of 5 nm thick barium (Ba) was vacuum deposited at about $1\times10^{-7}$ Torr through the mask, followed by a layer of 120 nm thick silver (Ag) on top of the Ba layer to lower the electrode resistance and provide protection for the Ba layer. The devices were then encapsulated in the Ar glove box using a glass cover lid and UV curable epoxy (UV15, from Master Bond, Inc). The device testing was carried out in air at room temperature. The thicknesses of the films were determined with a KLA Tencor P15 surface profilometer. Current-voltage characteristics were measured on a Keithley 2400 SoureMeter. A 150 W ozone free xenon lamp from Thermal Oriel was used as the illuminating light source for the characterization of PV devices. Higher open-circuit voltage and short-circuit current were obtained using PTT:Nafion® film spin coated from Dispersion E as the HEL.

TABLE 1

Performance summary of OPVD devices.

| Illumination Power (mW/cm$^2$) | HEL | Jsc (mA/cm$^2$) | Voc (V) | FF |
|---|---|---|---|---|
| 1300 | PTT:Nafion ® | 1.36 | 0.55 | 0.26 |
|  | PEDOT:PSSA | 0.52 | 0.35 | 0.24 |
| 180 | PTT:Nafion ® | 0.39 | 0.50 | 0.28 |
|  | PEDOT:PSSA | 0.20 | 0.40 | 0.24 |
| 130 | PTT:Nafion ® | 0.11 | 0.45 | 0.29 |
|  | PEDOT:PSSA | 0.056 | 0.35 | 0.25 |

Example 9

Figure 11:
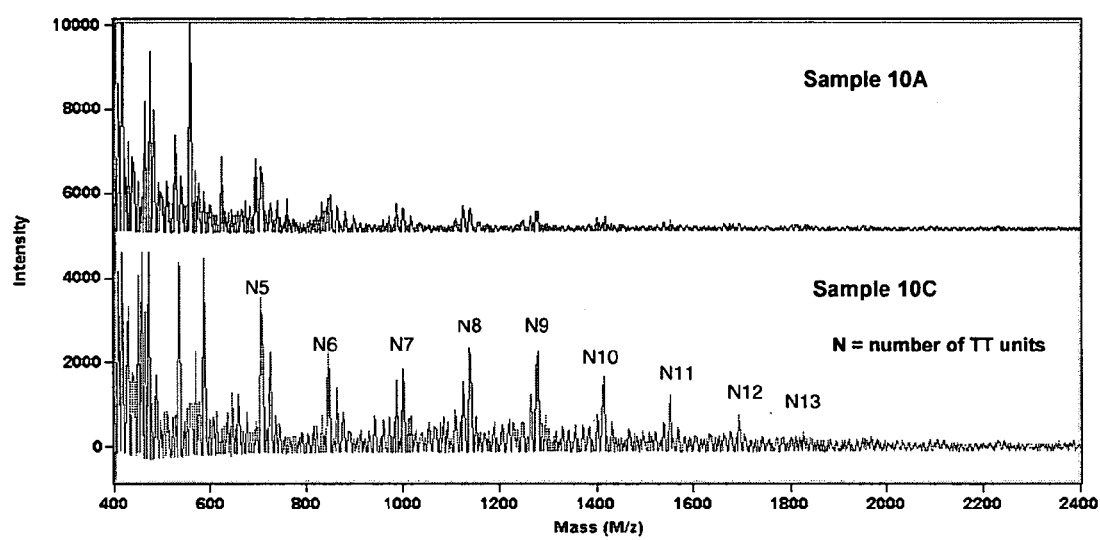
FIG. 11 illustrates MALDI Mass Spectrum of the samples 10A (top) and 10C (bottom) prepared in Example 10.

A dispersion was made according to the procedure described in Dispersion E in Experiment 1. 3 mL of the dispersion was drop cast onto a 1"×3" glass substrate. After the dispersion was dried, the substrate was cut into three 1"×1" samples, which are referred to hereafter as Sample 10A, Sample 10B and Sample 10C. Sample 10B and 10C were then annealed at 160 and 180° C. for 15 min in air using a hotplate, respectively. All 3 samples were then analyzed for molecular weight using matrix assisted laser desorption/ionization time-of-flight (MALDI-TOF) mass-spectroscopy on a Biflex III instrument from Bruker Daltonics, Billerica, Mass., USA. 7,7',8,8'-tetracyanoquinodimethane (TCNQ, from Aldrich) was used as the matrix. For sample preparation, a few flakes of thin film of Sample 10A, 10B or 10C was mixed with ~3 mg of TCNQ on the MALDI plate. The MALDI-TOF mass spectroscopy results showed that after the annealing at elevated temperatures, there were more polythienothiophene chains with larger number of repeat units. FIG. 11 shows the MALDI-TOF mass spectra of Sample 10A and 10C. The results indicate that when the conductive polymer films are annealed at elevated temperatures, further polymerization occurs in the solid state, which increases the chain length of the conductive polymers.

The invention claimed is:

1. An aqueous dispersion comprising polythienothiophene, at least one hydroxide, at least one colloid-forming polymeric acid, and mixtures thereof; wherein the colloid-forming polymeric acid comprising at least one fluorinated sulfonic acid polymer, and the amount of said at least one hydroxide is sufficient to adjust the pH of the dispersion to above 3.0;

wherein said polythienothiophene comprises the following structure:

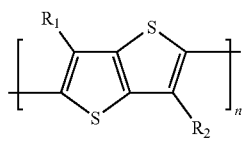

Wherein R1 and R2 are independently selected from the group consisting of H, alkyl group having 1 to 8 carbon atoms, phenyl, substituted phenyl, $C_mF_{2m+1}$, F, Cl, and SF5, and n is greater than about 2 and less than 20.

2. The aqueous dispersion of claim 1 wherein said at least one colloid-forming polymer acid has a structure comprising:

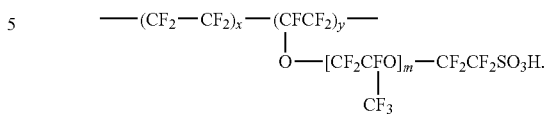

3. The aqueous dispersion of claim 1 wherein the dispersion further comprises at least metal selected from the group consisting of iron, potassium and sodium.

4. The aqueous dispersion of claim 3 wherein the metal comprises iron.

5. The aqueous dispersion of claim 1 further comprising at least one surfactant selected from the group consisting of fluorosurfactants and acetylenic diols.

6. The dispersion of claim 1 wherein the hydroxide comprises sodium hydroxide.

7. The aqueous dispersion of claim 1 wherein the hydroxide comprises ammonium hydroxide.

8. The aqueous dispersion of claim 1 wherein the hydroxide comprises at least one of calcium hydroxide and cesium hydroxide.

9. An aqueous dispersion comprising at least one polythienothiophene, at least one fluorinated sulfonic acid polymer, at least one surfactant selected from the group consisting of fluorosurfactants and acetylenic diols, at least one member selected from the group consisting of sodium hydroxide, ammonium hydroxide, tetra-methylammonium hydroxide, calcium hydroxide and cesium hydroxide, and mixtures thereof; wherein the pH of the dispersion is above about 3.5;

wherein said polythienothiophene comprises the following structure:

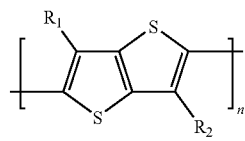

Wherein R1 and R2 are independently selected from the group consisting of H, alkyl group having 1 to 8 carbon atoms, phenyl, substituted phenyl, $C_mF_{2m+1}$, F, Cl, and SF5, and n is greater than about 2 and less than 20.

10. The aqueous dispersion of claim 9 wherein the surfactant comprises a fluorosurfactant and said fluorosurfactant comprises a non-ionic fluorosurfactant.

11. The aqueous dispersion of claim 10 wherein the non-ionic flurosurfactant comprises a fluorosufactant having a structure:

RfCH2CH2O(CH2CH2O)xH, where Rf=F(CF2CF2)y, x=0 to about 15 and y=1 to about 7.

12. The aqueous dispersion of claim 9 further comprising at least one member selected from the group consisting of ethers, alcohols, ethers, ketones, nitriles, and sulfoxides.

13. The aqueous dispersion of claim 9 wherein the dispersion further comprises at least one member selected from the group consisting of n-propanol, isopropanol, t-butanol, methanol, dimethylacetamide, dimethylformamide, N-methylpyrrolidone, p-toluenesulfonic acid, dodecylbenzenesulfonic acid, methanesulfonic acid, trifluoromethanesulfonic acid, camphorsulfonic acid, and acetic acid.

14. The aqueous dispersion of claim 9 wherein the dispersion further comprises at least one member selected from the group consisting of sulfonated styrene-divinylbenzene copolymers, sulfonated crosslinked styrene polymers, phenol-formaldehyde-sulfonic acid resins, benzene-formaldehyde-sulfonic acid resins, carboxylic acid, acrylic and phosphoric acid cation exchange resins, tertiary-aminated styrene-divinylbenzene copolymers, tertiary-aminated crosslinked styrene polymers, tertiary-aminated phenol-formaldehyde resins, tertiary-aminated benzene-formaldehyde resins, and quaternary amine anion exchange resins.

15. The aqueous dispersion of claim 9 wherein the dispersion comprises: Al(<=7 ppm); Ba(<1 ppm); Ca(<20 ppm); Cr(<1 ppm), Fe(<156 ppm); Mg(<5 ppm); Mn(<1 ppm); Ni(<=7 ppm); Zn(<5 ppm); Na(<2 ppm); and K(<59 ppm) when measured by ICP-MS.

16. A composition comprising water, at least one polythienothiophene, at least one member selected from the group consisting of sodium hydroxide, ammonium hydroxide, tetramethylammonium hydroxide, calcium hydroxide and cesium hydroxide; at least one fluorinated sulfonic acid polymer, and mixtures thereof, and wherein the amount of said at least one member is sufficient to impart a pH to the composition of above 3.0;

wherein said polythienothiophene comprises the following structure:

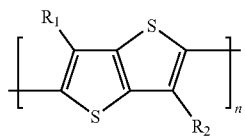

Wherein R1 and R2 are independently selected from the group consisting of H, alkyl group having 1 to 8 carbon atoms, phenyl, substituted phenyl, $C_mF_{2m+1}$, F, Cl, and SF5, and n is greater than about 2 and less than 20.

17. A dispersion comprising: water, polythienothiophene, at least one hydroxide, at least one fluorinated sulfonic acid polymer, at least one metal selected from the group consisting of iron, potassium and sodium, and mixtures thereof; wherein the amount of said at least one hydroxide is sufficient to adjust the pH of the dispersion to above 3.0;

wherein said polythienothiophene comprises the following structure:

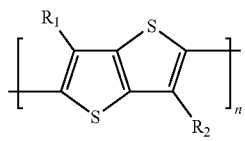

Wherein R1 and R2 are independently selected from the group consisting of H, alkyl group having 1 to 8 carbon atoms, phenyl, substituted phenyl, $C_mF_{2m+1}$, F, Cl, and SF5, and n is greater than about 2 and less than 20.

18. The dispersion of claim 17 wherein the metal comprises iron.

19. A dispersion comprising: water, at least one liquid that is miscible with water, at least one polythienothiophene, at least one hydroxide, at least one fluorinated sulfonic acid polymer, at least one conductive material; and wherein the amount of said at least one hydroxide is sufficient to adjust the pH of the dispersion to above about 3.0;

wherein said polythienothiophene comprises the following structure:

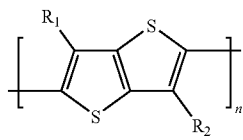

Wherein R1 and R2 are independently selected from the group consisting of H, alkyl group having 1 to 8 carbon atoms, phenyl, substituted phenyl, $C_mF_{2m+1}$, F, Cl, and SF5, and n is greater than about 2 and less than 20.

20. The dispersion of claim 19 wherein the conductive material comprises at least one member selected from the group consisting of metals and carbon.

21. A dispersion comprising: water, at least one polythienothiophene, at least one hydroxide, at least one fluorinated sulfonic acid polymer, at least one conductive material and at least one ion exchange resin; wherein the dispersion has a pH greater than about 3.0;

wherein said polythienothiophene comprises the following structure:

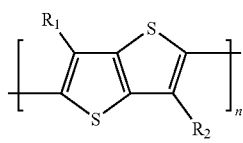

Wherein R1 and R2 are independently selected from the group consisting of H, alkyl group having 1 to 8 carbon atoms, phenyl, substituted phenyl, $C_mF_{2m+1}$, F, Cl, and SF5, and n is greater than about 2 and less than 20.

22. The dispersion of claim 21 wherein the at least one ion exchange resin comprises at least one anionic ion exchange resin.

* * * * *